US009858847B2

(12) United States Patent
Matsueda et al.

(10) Patent No.: US 9,858,847 B2
(45) Date of Patent: Jan. 2, 2018

(54) PIXEL ARRAY, ELECTRO OPTICAL DEVICE, ELECTRIC APPARATUS AND METHOD OF DRIVING PIXEL ARRAY

(71) Applicant: NLT Technologies, Ltd., Kanagawa (JP)

(72) Inventors: Yojiro Matsueda, Kanagawa (JP); Kenichi Takatori, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 0 days.

(21) Appl. No.: 14/995,714

(22) Filed: Jan. 14, 2016

(65) Prior Publication Data
US 2016/0203748 A1    Jul. 14, 2016

(30) Foreign Application Priority Data

Jan. 14, 2015  (JP) .................... 2015-004706

(51) Int. Cl.
*G09G 3/36*  (2006.01)
*G09G 3/20*  (2006.01)
*G09G 3/3233*  (2016.01)
*H01L 27/32*  (2006.01)

(52) U.S. Cl.
CPC ......... *G09G 3/2003* (2013.01); *G09G 3/2074* (2013.01); *G09G 3/3233* (2013.01); *H01L 27/3218* (2013.01); *H01L 27/3276* (2013.01); *G09G 2300/0426* (2013.01); *G09G 2300/0452* (2013.01); *G09G 2320/0666* (2013.01); *H01L 27/3216* (2013.01)

(58) Field of Classification Search
CPC .. G09G 5/10; G09G 5/02; G09G 3/36; G09G 3/30; G09G 5/00; G06K 15/00; G06F 3/038
See application file for complete search history.

(56) References Cited

U.S. PATENT DOCUMENTS

| 6,771,028 B1 | 8/2004 | Winters |
| 8,687,161 B2* | 4/2014 | Kasahara ............ H01L 27/1214 257/202 |
| 2002/0186214 A1 | 12/2002 | Siwinski |
| 2003/0071943 A1* | 4/2003 | Choo ................ G02F 1/133514 349/106 |
| 2004/0113875 A1 | 6/2004 | Miller et al. |

(Continued)

FOREIGN PATENT DOCUMENTS

JP    2011-249334    12/2011

*Primary Examiner* — Pegeman Karimi
(74) *Attorney, Agent, or Firm* — Young & Thompson

(57) ABSTRACT

In a pixel array, pixels are two-dimensionally arranged, each of the pixels including a subpixel of the first color having a highest luminosity factor, a subpixel of the second color and a subpixel of the third color having a lowest luminosity factor. A circuit element in each of subpixels of the first color to the third color in each of the pixels is arranged in a row direction. A light emitting region of a subpixel of the first color and a light emitting region of a subpixel of the second color are arranged in the first direction inclined to the row direction. A light emitting region of a subpixel of the third color is arranged in the second direction orthogonal to the first direction, with respect to the light emitting region of the subpixel of the first color and the light emitting region of the subpixel of the second color.

20 Claims, 37 Drawing Sheets

(56) References Cited

U.S. PATENT DOCUMENTS

| | | | |
|---|---|---|---|
| 2004/0201558 A1 | 10/2004 | Arnold et al. | |
| 2010/0156279 A1* | 6/2010 | Tamura | H01L 27/3211 313/504 |
| 2011/0157502 A1* | 6/2011 | Qiao | G09G 3/3614 349/37 |
| 2011/0227965 A1* | 9/2011 | Mori | G09G 3/3607 345/690 |
| 2011/0291550 A1 | 12/2011 | Kim et al. | |
| 2012/0147065 A1* | 6/2012 | Byun | G09G 3/3208 345/690 |
| 2013/0155034 A1* | 6/2013 | Nakayama | G09F 9/35 345/204 |
| 2015/0270317 A1* | 9/2015 | Lee | H01L 27/3218 257/40 |

\* cited by examiner

FIG. 2
RELATED ART
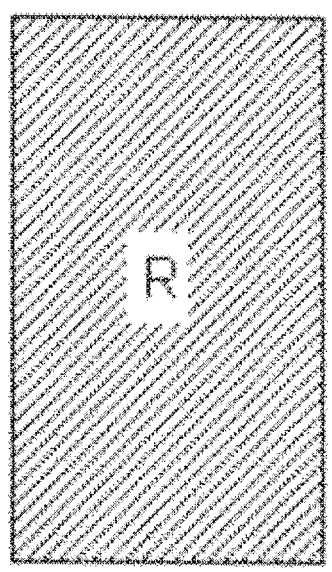
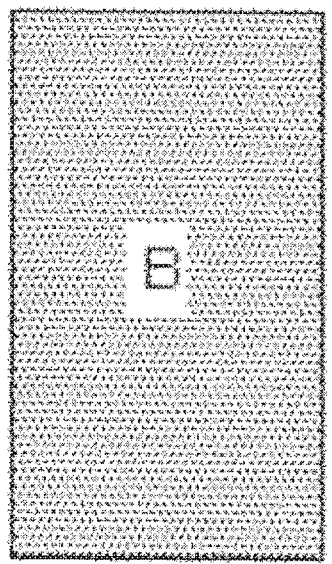

FIG. 10
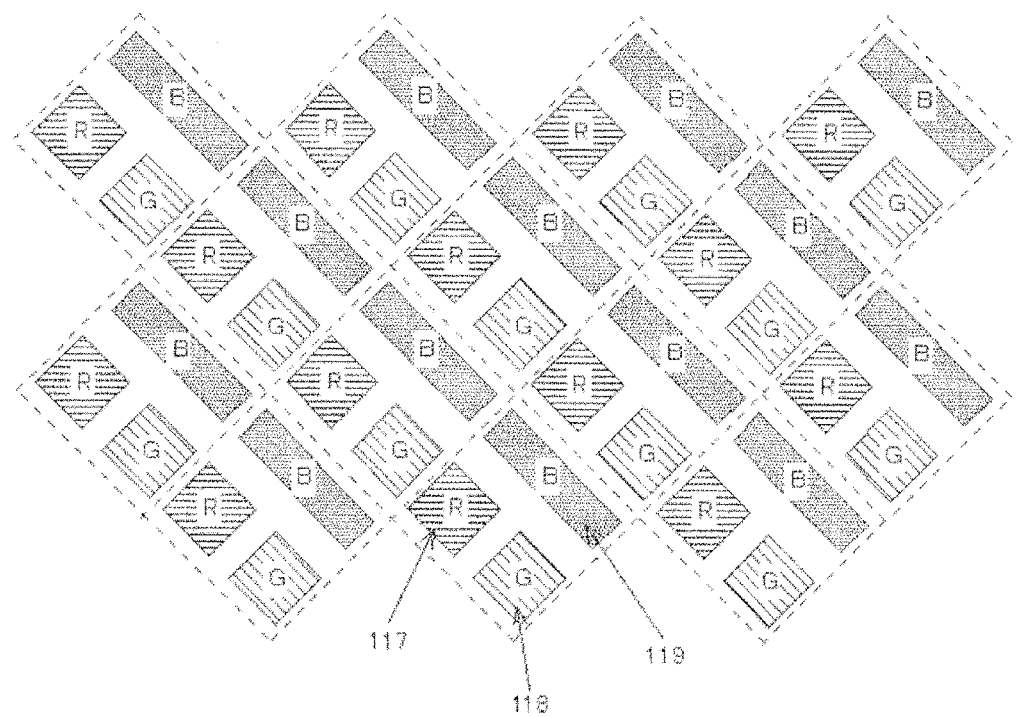
FIRST PIXEL ARRANGEMENT STRUCTURE
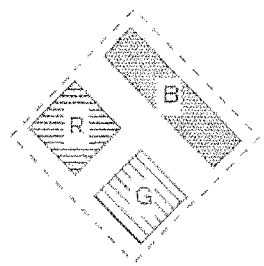
UNIT PIXEL

FIG. 12
SECOND PIXEL ARRANGEMENT STRUCTURE
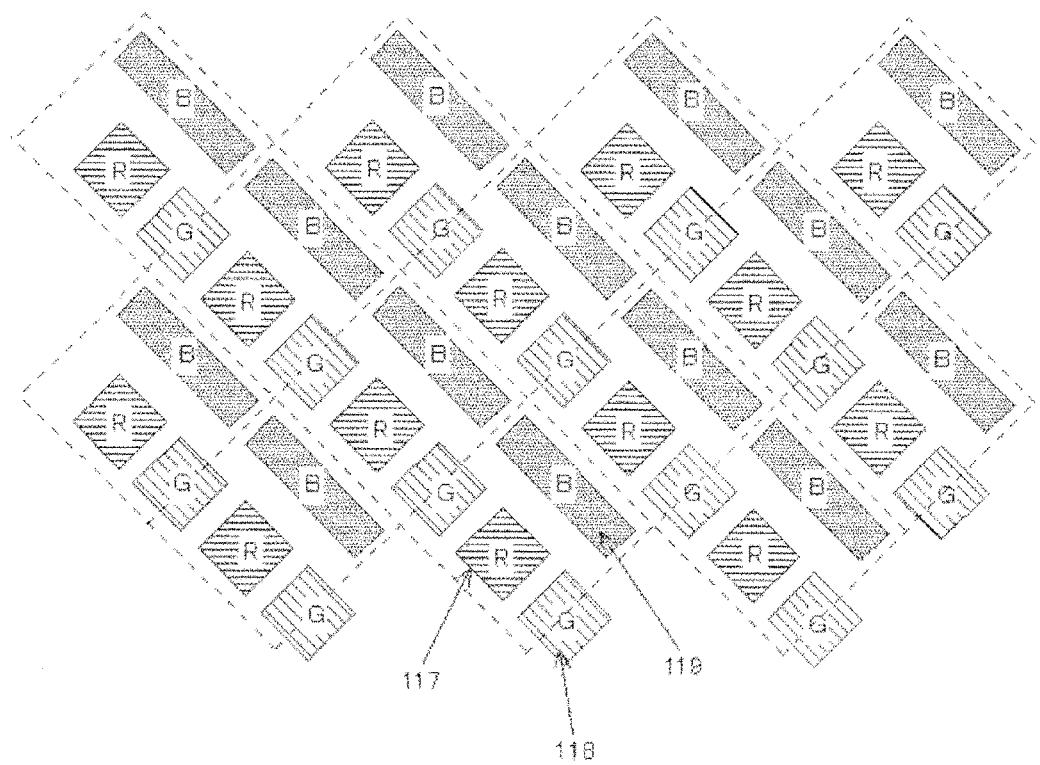
UNIT PIXEL
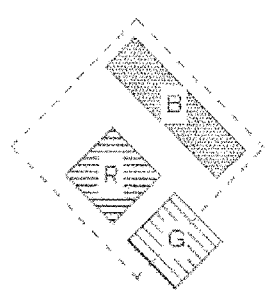

WHITE FRAME IN WHICH SUBPIXELS OF B ARE LOCATED AT CORNERS

400

PIXEL ARRAY, ELECTRO OPTICAL DEVICE, ELECTRIC APPARATUS AND METHOD OF DRIVING PIXEL ARRAY

CROSS-REFERENCE TO RELATED APPLICATION

This non-provisional application claims priority under 35 U.S.C. §119(a) on Patent Application No. 2015-4706 filed in Japan on Jan. 14, 2015, the entire contents of which are hereby incorporated by reference.

FIELD

The present invention relates to a pixel array, an electro optical device including the pixel array, an electric apparatus utilizing the electro optical device as a display device, and a method of driving pixel array.

BACKGROUND

Since an organic Electro Luminescence (EL) element is a self-light-emitting element of a current driven type, the need for a backlight is eliminated while the advantage of low power consumption, high viewing angle, high contrast ratio or the like is obtained; it is expected to perform well in the development of a flat panel display.

In an organic EL display device using such an organic EL element, subpixels of different colors of red (R), green (G) and blue (B) are used to constitute a large number of pixels, which makes it possible to display various kinds of color images. While these subpixels of R, G, and B (RGB) may be located in various different forms, they are generally arranged in stripes by equally placing subpixels of different colors (so-called RGB vertical stripe arrangement), as illustrated in FIG. 1. All colors can be displayed by adjusting the brightness among the three subpixels. In general, adjacent three subpixels of R, G and B are collectively regarded as one rectangular pixel, and such rectangular pixels are arranged in a square to realize a dot matrix display. In the display device of a dot matrix type, image data to be displayed has a matrix arrangement of n×m. A correct image can be displayed by associating the image data with each pixel one for one.

Furthermore, organic EL devices have different structures including a color filter type which creates the three colors of RGB with a color filter on the basis of a white organic EL element, and a side-by-side selective deposition type which deposits different colors on the respective organic EL materials for the three colors of RGB. While the color filter type has a disadvantage in that the light use efficiency is lowered as the color filter absorbs light, resulting in higher power consumption, the side-by-side selective deposition type can easily have wider color gamut due to its high color purity and can have higher light use efficiency because a color filter is eliminated, thereby being widely used.

In the side-by-side selective deposition type, Fine Metal Mask (FMM) is used in order to individually color organic EL materials. It is, however, difficult to fabricate FMM because pitches thereof are made finer to be adapted for recent highly-refined organic EL display devices. To address such a problem, using the characteristics of human color vision, i.e. human eye being insensitive to R and B whereas sensitive to G, a pixel arrangement structure in which subpixels are constituted with two colors of G and B, or G and R, and a color expression requiring a subpixel of a missing color compared to the RGB arrangement is reproduced into a pseudo array by combining the two-color subpixels with an adjacent pixel having a subpixel of the missing color (so-called PenTile (registered trademark) arrangement) has been proposed (U.S. Pat. No. 6,771,028, US Patent Application Publication No. 2002/0186214, US Patent Application Publication No. 2004/0113875 and US Patent Application Publication No. 2004/0201558, for example).

The PenTile arrangement causes a dot width for R and B corresponding to two vertical stripes, reduces the number of subpixels, allows the aperture size of FMM to be larger and thus facilitates the manufacturing of a highly refined organic EL display device. However, the PenTile arrangement uses the tiling method to alleviate a color failure due to reduction in the number of subpixels. Therefore, the PenTile arrangement causes a jaggy in which curve lines of an image to be displayed smoothly are displayed in a staircase pattern, or a defect in which color changes are viewed as lines in an image with continuously changing color tone or luminance.

In the background as described above, a pixel arrangement structure which can increase the dimension of a subpixel compared to the conventional RGB vertical stripe arrangement and which causes less degrading in display quality as in the PenTile arrangement has been proposed. This structure is a pixel arrangement structure (so-called "S stripe arrangement") in which R and G are located in the same column while B is located in the column subsequent to R and G, as well as in the row of R and G, as illustrated in FIG. 3 (Japanese Patent Application Laid-Open Publication No. 2011-249334, for example). This S stripe arrangement allows the width of a subpixel to be wider than that in the RGB vertical stripe arrangement, which can increase the aperture size of FMM and can also enhance the display quality compared to the PenTile arrangement because subpixels of RGB are located in one pixel.

SUMMARY

While a display with a certain degree of resolution may be manufactured using the S stripe arrangement described above, it is necessary to further reduce the pixel size in order to manufacture a display with higher resolution. However, if the aperture size of FMM is reduced in order to make the pixel size smaller, the selective deposition of the organic EL materials becomes difficult even if the S stripe arrangement is employed, causing such a problem that an organic EL display having high resolution cannot be manufactured with a high yield ratio.

In a pixel array according to an aspect, pixels are two-dimensionally arranged, each of the pixels being constituted by a subpixel of a first color having a highest luminosity factor, a subpixel of a second color and a subpixel of a third color having a lowest luminosity factor. A circuit element in each of subpixels of the first color, the second color and the third color in each of the pixels is arranged in a row direction. A light emitting region of a subpixel of the first color and a light emitting region of a subpixel of the second color are arranged in a first direction inclined to the row direction. A light emitting region of a subpixel of the third color is arranged in a second direction orthogonal to the first direction, with respect to the light emitting region of the subpixel of the first color and the light emitting region of the subpixel of the second color. A data line extends in a column direction and is connected to a circuit element in a subpixel. The data line connected to circuit elements in subpixels of two colors of the first color and the second color, the data line connected to circuit elements in subpixels of two colors of the second color and the third color, and the data line connected to circuit elements in subpixels of two colors of the third color and the first color are repeatedly arranged.

An electro optical device according to an aspect comprises: the pixel array; and a circuit part driving the pixel array.

An electric apparatus according to an aspect comprises, as a display device, an organic electroluminescence device in which the pixel array including an organic electroluminescence material in the light emitting region and a circuit part driving the pixel array are formed on a substrate.

In a method of driving a pixel array according to an aspect, pixels are two-dimensionally arranged, each of the pixels being constituted by a subpixel of a first color having a highest luminosity factor, a subpixel of a second color and a subpixel of a third color having a lowest luminosity factor. A light emitting region of a subpixel of the first color and a light emitting region of a subpixel of the second color are arranged in a first direction inclined to a side of a display region, and a light emitting region of a subpixel of the third color is arranged in a second direction orthogonal to the first direction, with respect to the light emitting region of the subpixel of the first color and the light emitting region of the subpixel of the second color. The method comprises: categorizing drive patterns for the pixels into a first pattern in which all of a subpixel of the first color, a subpixel of the second color and a subpixel of the third color are turned on, a second pattern in which a subpixel of the first color and a subpixel of the second color are turned on, a third pattern in which a subpixel of the first color and a subpixel of the third color are turned on, a fourth pattern in which a subpixel of the second color and a subpixel of the third color are turned on, a fifth pattern in which a subpixel of the first color is turned on, a sixth pattern in which a subpixel of the second color is turned on, and a seventh pattern in which a subpixel of the third color is turned on; deciding a combination of patterns corresponding to a plurality of pixels adjacent to each other in the first direction or the second direction near a boundary of the image, depending on an image to be displayed in the display region; and driving the plurality of pixels with a decided combination of patterns.

It is to be understood that both the foregoing general description and the following detailed description are exemplary and explanatory and are not restrictive of the invention.

BRIEF DESCRIPTION OF THE DRAWINGS

FIG. 2 is a plan view schematically illustrating a pixel arrangement structure (PenTile arrangement) of the conventional organic EL display device;

FIG. 10 is a plan view illustrating a pixel arrangement structure (a first pixel arrangement structure) according to an embodiment;

FIG. 12 is a plan view illustrating a pixel arrangement structure (a second pixel arrangement structure) according to an embodiment;

DETAILED DESCRIPTION

Figure 1:
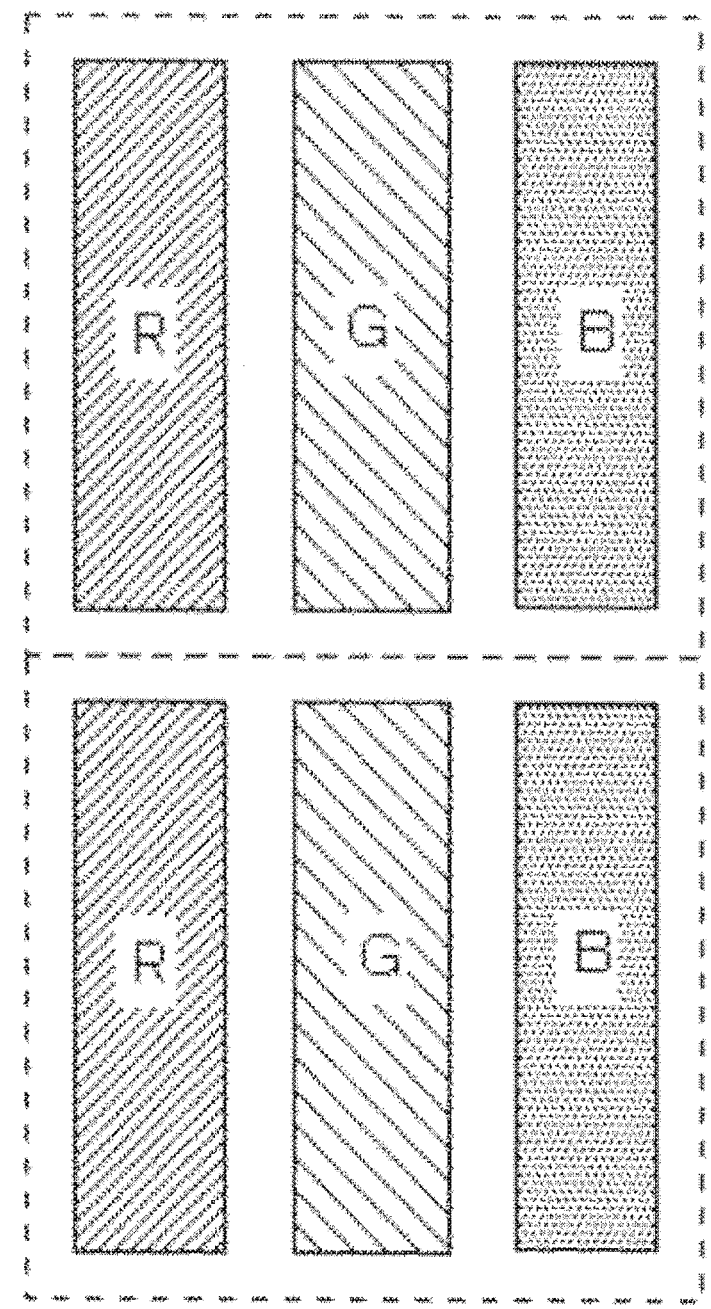
FIG. 1 is a plan view schematically illustrating a pixel arrangement structure (RGB vertical stripe arrangement) of the conventional organic EL display device.

As described in the background technique, a pixel arrangement structure has been proposed in which R and G are arranged adjacent to each other in the same column while B is arranged at a position in the column next to R and G as well as in the row of R and G (so-called S stripe arrangement).

While a display with a resolution of a certain degree (e.g., approximately corresponding to full high definition (1920× 1080 pixels)) may be manufactured using the S stripe arrangement described above, it is necessary to further reduce the pixel size in order to manufacture a display with higher resolution (e.g., approximately corresponding to 4K (3840×2160 pixels)). However, reduction in the aperture size of FMM in order to reduce the pixel size makes the selective deposition of organic EL materials difficult despite of the S stripe arrangement, causing such a problem that an organic EL display with high resolution cannot be manufactured with a high yield ratio.

According to an embodiment, in order to make it possible to manufacture a display with resolution higher than that in the S stripe arrangement without reduction in the pixel size (i.e., without reducing the size of the aperture in FMM defining the light emitting region of a subpixel of each color), a pixel array in the S stripe arrangement is inclined at a predetermined angle, and pixel pitches in the horizontal and vertical directions are substantially narrowed to increase the resolution. Then, in order to make the light emitting region of each subpixel inclined without changing the extending direction of wirings as well as circuit elements for driving each subpixel, the data line for driving each subpixel is connected to a subpixel of either one of two colors (to a subpixel of one color in an odd-numbered column and to a subpixel of the other color in an even-numbered column), and the combination of two colors is changed in rotation.

Moreover, in the case where a pixel array is inclined, it is necessary to light pixels in a zig-zag manner for displaying a straight line extending in the horizontal or vertical direction. Therefore it is difficult to display a smooth boundary of the image. Thus, according to one embodiment, subpixels of adjacent pixels are combined to display an image, instead of using RGB subpixels in each pixel to display an image. More specifically, the drive pattern of each pixel is categorized into seven patterns in total, including one pattern in which all subpixels of RGB are turned on, three patterns in which two of the RGB subpixels are turned on and three patterns in which one of the RGB subpixels is turned on. And adjacent pixels are driven by combining the patterns from these seven patterns depending on an image to be displayed, to display a smooth boundary of an arbitrary image.

The embodiment of the present invention will be described below with reference to the drawings. It is to be noted that an electro optical element means a general electron element which changes the optical state of light by an electric action, and includes, in addition to a self-light-emitting element such as an organic EL element, an electron element such as a liquid-crystal element which changes the polarization state of light to implement gradation display. Furthermore, an electro optical device means a display device utilizing an electro optical element for display. Since an organic EL element is suitable and the use of an organic EL element can obtain a current-driven light emitting element which allows self-light emission when driven with current, an organic EL element is given as an example in the description below.

Figure 4:
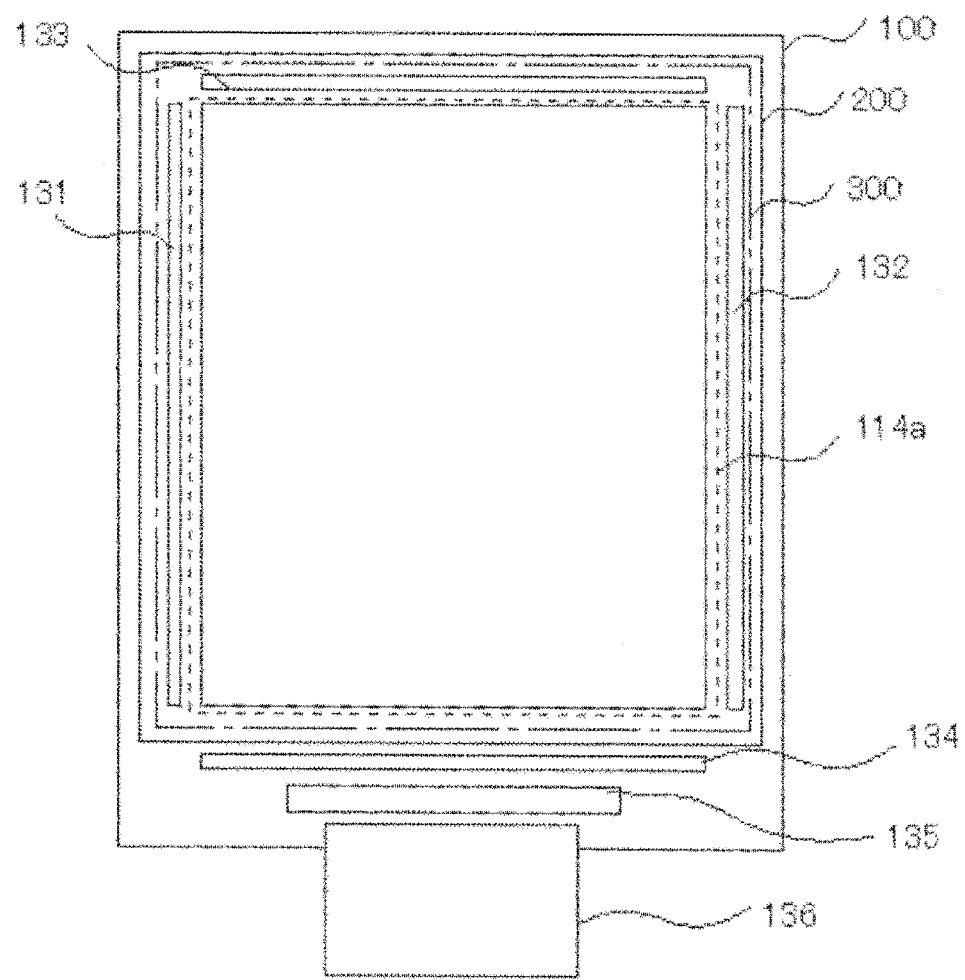
FIG. 4 is a plan view illustrating an organic EL display device according to an embodiment.

FIG. 4 illustrates an organic EL display device as an example of an electro optical device. The organic EL display device includes, as main components, a thin film transistor (TFT) substrate 100 on which a light emitting element is formed, a sealing glass substrate 200 which seals the light emitting element, and a bonding means (glass frit seal part) 300 which bonds the TFT substrate 100 to the sealing glass substrate 200. Moreover, around a cathode electrode forming region 114a outside the display region of the TFT substrate 100 (active matrix section), for example, a scanning driver 131 (TFT circuit) which drives a scanning line on the TFT substrate 100, an emission control driver 132 (TFT circuit) which controls the light emission period of each pixel, a data line electro-static-discharge (ESD) protection circuit 133 which prevents damage caused by electrostatic discharge, a demultiplexer (1:n DeMUX 134) which returns a stream at a high transfer rate to multiple streams at a former low transfer rate, a data driver IC 135 which is mounted using an anisotropic conductive film (ACF) and which drives a data line are located. The organic EL display device is connected with an external device through a flexible printed circuit (FPC) 136. Since FIG. 4 is a mere example of an organic EL device according to the present embodiment, the shape and configuration thereof may appropriately be modified.

Figure 5:
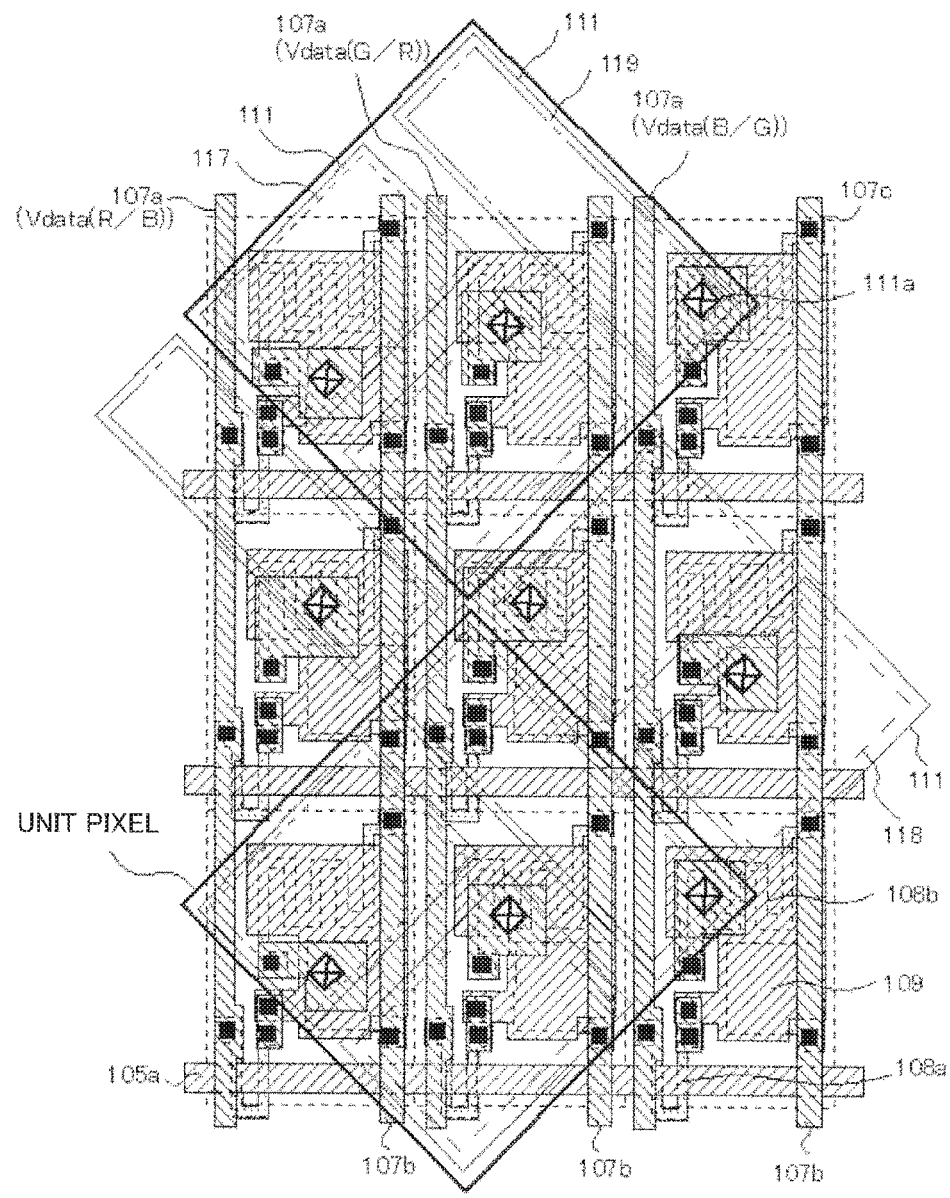
FIG. 5 is a plan view schematically illustrating a configuration of pixels (corresponding to nine subpixels) in an organic EL display device according to an embodiment.
Figure 6:
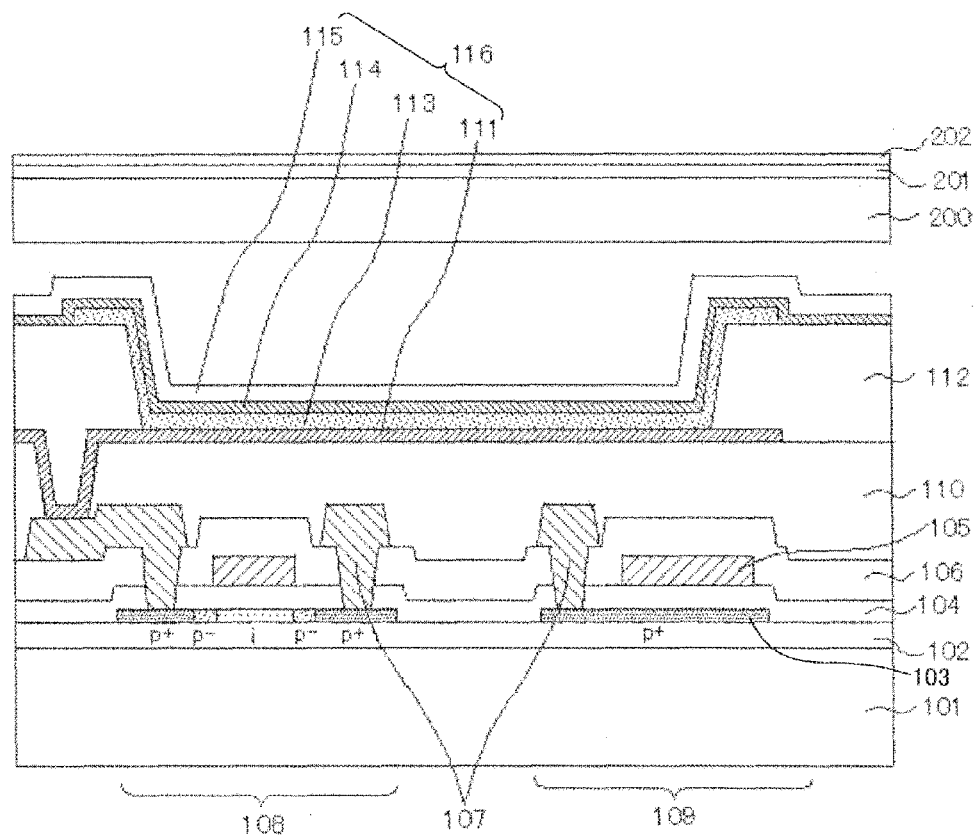
FIG. 6 is a section view schematically illustrating a configuration of a pixel (corresponding to one subpixel) in an organic EL display device according to an embodiment.

FIG. 5 is a plan view specifically illustrating nine subpixels and light emitting regions connected to the respective subpixels formed on the TFT substrate 100. Pixels each of which is composed of the light emitting regions of three color RGB connected to three subpixels are repeatedly formed in a direction inclined (herein inclined at 45 degrees) to the extending direction of data line (vertical direction in FIG. 5) and the extending direction of scanning line (horizontal direction in FIG. 5). FIG. 6 is a section view specifically illustrating one subpixel. In FIG. 6, for clarifying the structure of a subpixel according to the present embodiment, the regions of a TFT part 108b (M2 drive TFT) and a retention capacitance part 109 in the plan view of FIG. 5 are taken out and simplified for their illustration.

The TFT substrate 100 is constituted by: a poly silicon layer 103 made of low-temperature poly silicon (LTPS) or the like formed on a glass substrate 101 through an underlying insulation film 102; a first metal layer 105 (a gate electrode 105a and a retention capacitance electrode 105b) formed through a gate insulation film 104; a second metal layer 107 (a data line 107a, a power supply line 107b, a source/drain electrode, a first contact part 107c) connected to the poly silicon layer 103 through an aperture formed at an interlayer insulation film 106; and a light emitting element 116 (an anode electrode 111, an organic EL layer 113, a cathode electrode 114 and a cap layer 115) formed through a planarization film 110. The source/drain electrode and the anode electrode 111 are connected via a second contact part 111a.

Dry air is enclosed between the light emitting element 116 and the sealing glass substrate 200, which is then sealed by the glass frit seal part 300, to form an organic EL display device. The light emitting element 116 has a top emission structure, in which the light emitting element 116 and the sealing glass substrate 200 are set to have a predetermined space between them while a λ/4 retardation plate 201 and a polarization plate 202 are formed on the side of the light emitting surface of the sealing glass substrate 200, so as to suppress reflection of light entering from the outside.

In FIG. 5, one pixel (unit pixel indicated by thick solid lines) is driven by three subpixels contiguously arranged in the row direction. Moreover, each subpixel is formed by a region enclosed by a data line 107a, a power supply line 107b and a gate electrode 105a, each region including a TFT part 108a (M1 switch TFT), a TFT part 108b (M2 drive TFT) and a retention capacitance part 109. Here, in the pixel arrangement structure according to the present embodiment, the arrangement direction of pixels constituted by light emitting regions of the three colors of RGB is inclined with respect to the arrangement direction of subpixels. Therefore it is necessary to find a way to appropriately connect the anode electrode 111 of the light emitting region of each color to the M2 drive TFT of each subpixel. In the present embodiment, therefore, the layout of components in a subpixel is changed between an even-numbered row and an odd-numbered row, while the data line 107a is separated into a data line for R/B subpixels (indicated as Vdata (R/B)), a data line for G/R subpixels (indicated as Vdata (G/R)) and a data line for B/G subpixels (indicated as Vdata (B/G)), and the three data lines are used in rotation.

More specifically, with regard to the subpixel of B having the lowest luminosity factor, for a subpixel in an odd-numbered row (subpixels on the right side in the upper and lower rows in FIG. 5 here), the TFT part 108a (M1 switch TFT) and the TFT part 108b (M2 drive TFT) are arranged in a region enclosed by the gate electrode 105a, the data line 107a for B/G and the power supply line 107b as illustrated in FIG. 5, while the second contact part 111a connecting the source/drain electrode of the M2 drive TFT to the anode electrode 111 is arranged on the upper left side of the subpixel. Furthermore, for a subpixel in an even-numbered row (subpixel on the left side in the middle row in FIG. 5), the TFT part 108a and TFT part 108b are arranged in the region enclosed by the gate electrode 105a, the data line 107a for R/B and the power supply line 107b as illustrated in FIG. 5, while the second contact part 111a is arranged slightly upper than the middle of the subpixel.

Furthermore, with regard to the subpixel of R, for a subpixel in an odd-numbered row (subpixels on the left side in the upper and lower rows in FIG. 5), the TFT part 108a and TFT part 108b are arranged in a region enclosed by the gate electrode 105a, the data line 107a for R/B and the power supply line 107b as illustrated in FIG. 5, while the second contact part 111a is arranged slightly lower than the middle of the subpixel. Moreover, for a subpixel in an even-numbered row (subpixel at the middle in the middle row in FIG. 5), the TFT part 108a and the TFT part 108b are arranged in a region enclosed by the gate electrode 105a, the data line 107a for G/R and the power supply line 107b as illustrated in FIG. 5, while the second contact part 111a is arranged slightly upper than the middle of the subpixel.

Furthermore, with regard to the subpixel of G having the highest luminosity factor, for a subpixel in an odd-numbered row (subpixels at the middle in the upper and lower rows in FIG. 5), the TFT part 108a and the TFT part 108b are arranged in a region enclosed by the gate electrode 105a, the data line 107a for G/R and the power supply line 107b as illustrated in FIG. 5, while the second contact part 111a is arranged slightly upper left side of the middle of the subpixel. Moreover, for a subpixel in an even-numbered row (subpixel on the right side in the middle row in FIG. 5), the TFT part 108a and TFT part 108b are arranged in a region enclosed by the gate electrode 105a, the data line 107a for B/G and the power supply line 107b as illustrated in FIG. 5, while the second contact part 111a is arranged slightly lower right side of the middle of the subpixel.

That is, in the pixel arrangement structure according to the present embodiment, the array of pixels constituted by light emitting regions of three colors of RGB is inclined with respect to the array of the regions enclosed by the gate electrode 105a, the data line 107a and the power supply line 107b. Therefore the positional relationship between the region enclosed by the wirings and the light emitting regions is inconstant. Thus, the layout of circuit elements (M1 switch TFT, M2 drive TFT, retention capacitance part 109 and second contact part 111a) in a subpixel is changed for each color and each row. Moreover, as the light emitting regions (anode electrodes 111) of different colors are not aligned (arranged in a zig-zag manner), a data line is shared by two colors of R/B, G/R or B/G instead of being dedicated to each color, and the combination of such colors is changed in rotation.

It is to be noted that the color having the highest luminosity factor and the color having the lowest luminosity factor as described in the present specification and claims have relative meanings, indicating "highest" and "lowest" in a comparison among multiple subpixels included in one pixel. Furthermore, the TFT part 108a (M1 switch TFT) is formed to have a dual gate structure as illustrated in FIG. 5 so as to suppress crosstalk from the data line 107a, and the TFT part 108b (M2 drive TFT) which converts voltage into current is formed to have a routed shape as illustrated in FIG.

5 in order to minimize the variation in the manufacturing process, thereby ensuring a sufficient channel length. Furthermore, the gate electrode of the M2 drive TFT is extended to be used as an electrode of the retention capacitance part 109 so as to ensure sufficient retention capacitance with a limited area. Such a pixel structure allows the colors of RGB to have larger light emitting regions, making it possible to lower the current density per unit area of each color for obtaining necessary luminance, and to extend the lifetime of a light emitting element.

While FIG. 6 illustrates a top emission structure in which light radiated from the light emitting element 116 is directed to the outside through the sealing glass substrate 200, a bottom emission structure may also be possible in which the light is radiated to the outside through the glass substrate 101.

Figure 7:
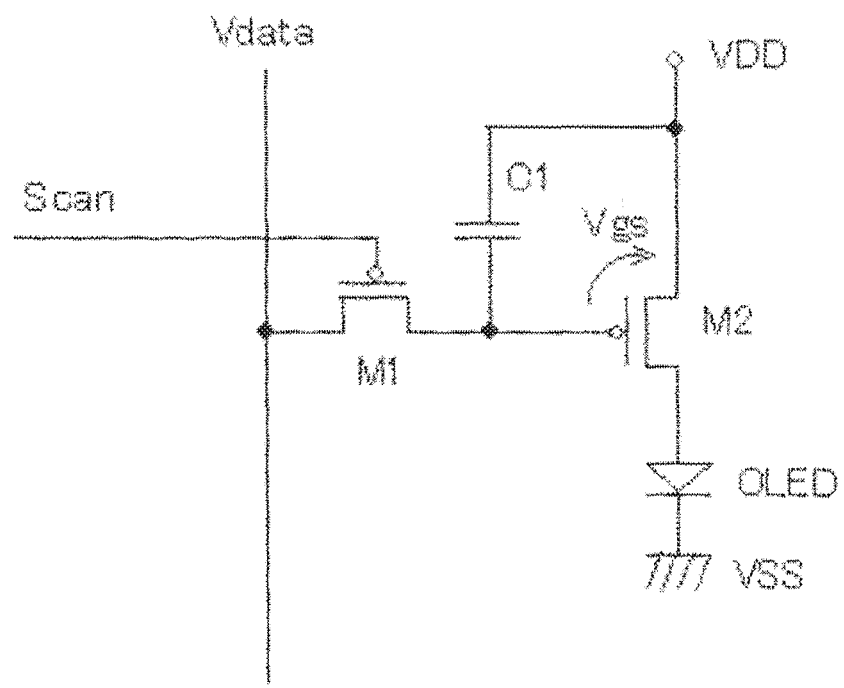
FIG. 7 is a main circuit configuration diagram of a pixel in an organic EL display device according to an embodiment.
Figure 8:
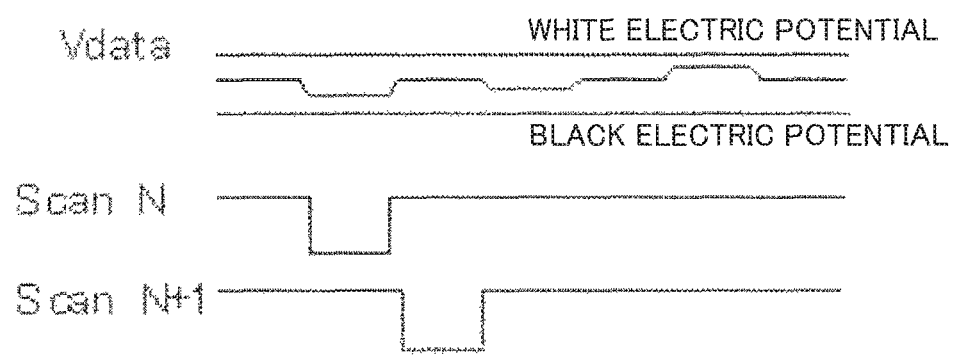
FIG. 8 is a waveform illustration of a pixel in an organic EL display device according to an embodiment.
Figure 9:
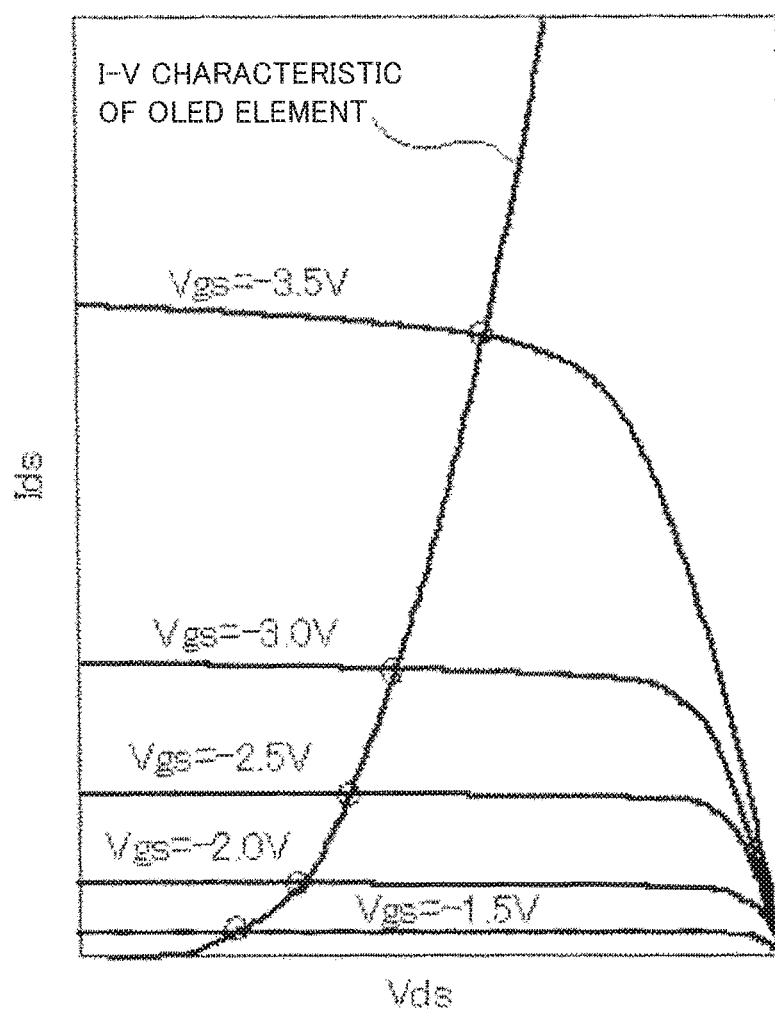
FIG. 9 is an output characteristic diagram of a drive TFT in an organic EL display device according to an embodiment.

Next, a method of driving each subpixel will be described with reference to FIGS. 7 to 9. FIG. 7 is a main circuit configuration diagram of a subpixel, FIG. 8 is a waveform and FIG. 9 illustrates an output characteristic of a drive TFT. Each subpixel is configured by including the M1 switch TFT, M2 drive TFT, C1 retention capacitance and light emitting element (OLED), and is drive-controlled with a two-transistor system. The M1 switch TFT is a p-channel field effect transistor (FET), the gate terminal of which is connected to a scanning line (Scan) and the drain terminal of which is connected to a data line (Vdata). The M2 drive TFT is a p-channel FET, the gate terminal of which is connected to the source terminal of the M1 switch TFT. Moreover, the source terminal of the M2 drive TFT is connected to the power supply line (VDD), whereas the drain terminal thereof is connected to the light emitting element (OLED). Furthermore, a C1 retention capacitance is formed between the gate and the source of the M2 drive TFT.

In the configuration described above, when a selection pulse is outputted to the scanning line (Scan) to make the M1 switch TFT in an open state, the data signal supplied through the data line (Vdata) is written into the C1 retention capacitance as a voltage value. The retention voltage written into the C1 retention capacitance is held over a period of one frame, the retention voltage causing the conductance of the M2 drive TFT to change in an analog manner, to supply forward bias current, corresponding to a gradation level of light emission, to the light emitting element (OLED).

As described above, since the light emitting element (OLED) is driven with constant current, the luminance of emitted light may be maintained to be constant despite a possible change in the resistance due to degrading of the light emitting element (OLED). Therefore, it is thus suitable for a method of driving an organic EL display device according to the present embodiment.

Next, the pixel arrangement structure of an organic EL display device with the above-described structure will be described with reference to FIGS. 10 to 13. Note that the subpixels of RGB illustrated in FIGS. 10 to 13 represent light emitting regions (where the organic EL layer 113 is interposed between the anode electrode 111 and the cathode electrode 114 in FIG. 6) serving as light emitting elements. The light emitting region represents an aperture of an element separation layer 112. In the case of selectively depositing organic EL material using FMM, FMM having an aperture slightly larger than the light emitting region is set in alignment with the TFT substrate, and organic EL material is selectively deposited. Since current actually flows only through the aperture of the element separation layer 112, this portion serves as a light emitting region. If an aperture pattern of FMM overlaps with an aperture of another color (if a region on which organic EL material is deposited widens), a failure in which another light emission color is mixed (color misalignment) occurs. In addition, if the pattern comes inside the aperture (i.e. if the region on which organic EL material is deposited narrows), there is a risk of a failure in which the anode electrode 111 and the cathode electrode 114 are short-circuited (vertical short-circuiting). Therefore, the aperture pattern of FMM is so designed as to be opened almost at the outside of the light emitting region of its own color and on a boundary at substantially the middle between the light emitting region of its own color and the light emitting region of another color. Though the alignment accuracy and the amount of variation in FMM is less than those in the photo process, the actual light emitting region is decided by the light emitting region opened by the photo process. Accordingly, it is possible to accurately control the area with any shape. Moreover, a boundary (broken line) of each pixel in FIGS. 10 to 13 is not defined by a component of the TFT substrate 100 but by the relationship between adjacent sets of subpixels in the case where sets of subpixels are repeatedly arranged, the boundary being illustrated as a rectangle here, though not limited thereto.

Figure 3:
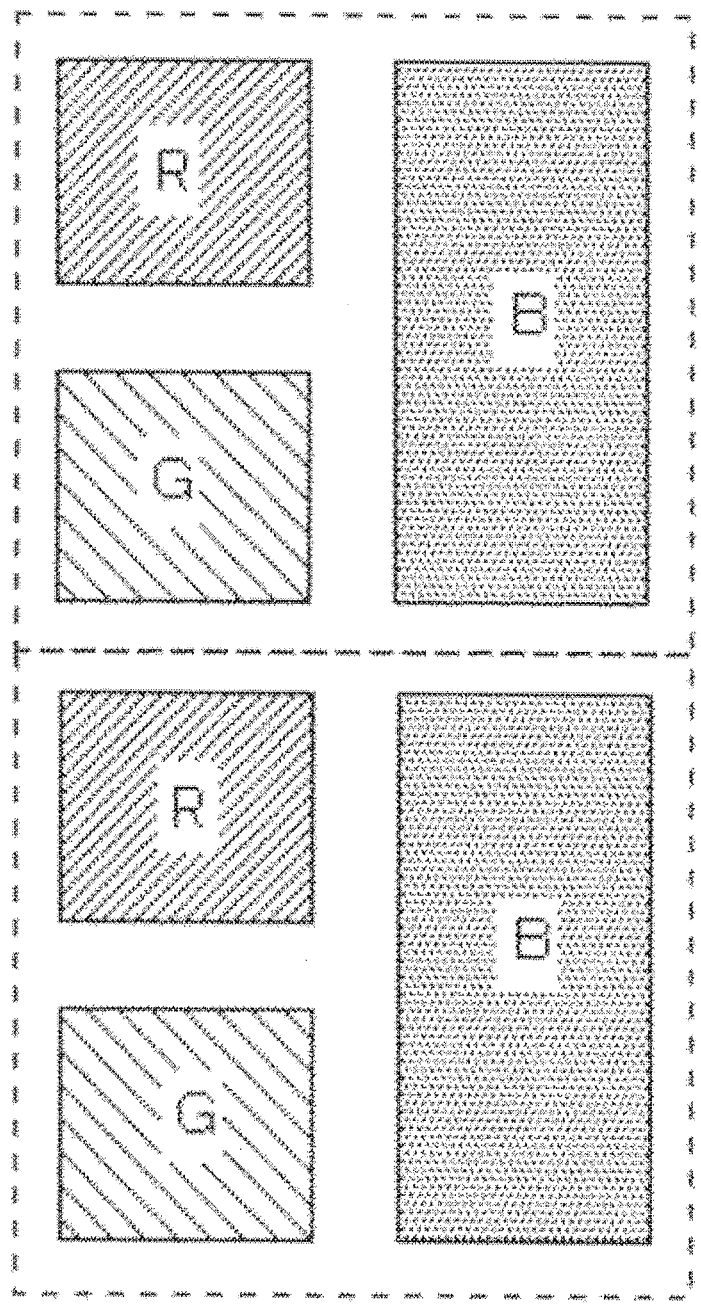
FIG. 3 is a plan view schematically illustrating a pixel arrangement structure (S stripe arrangement) of the conventional organic EL display device.

As illustrated in FIG. 10, the basic structure of the pixel arrangement according to the present embodiment is a pixel arrangement structure in which the pixel array in the S stripe arrangement illustrated in FIG. 3 is rotated counterclockwise by 45 degrees. That is, with respect to the diagonal direction from the upper left to the lower right (downward sloping direction) at an angle of 45 degrees, subpixels of B are contiguously arranged while subpixels of R and G are alternately arranged. With respect to the diagonal direction from the lower left to the upper right (upward sloping direction) at an angle of 45 degrees, the subpixels of B and R are alternately arranged while the subpixels of B and G are alternately arranged. Such a pixel arrangement structure is referred to as the first pixel arrangement structure.

Here, in a general S stripe pixel arrangement structure, a power supply line for supplying electric power to each of the subpixels of RGB, a data line for supplying a pixel signal and a gate electrode for supplying a scanning signal (scanning line) may be arranged to extend in the arrangement direction (horizontal/vertical direction) of pixels. However, in the pixel arrangement structure according to the present embodiment, if the power supply line, the data line and the scanning line extend in the arrangement direction (diagonal direction) of pixels, not only the power supply line or data line but also the scanning line need to be switched when controlling pixels with the same horizontal position, making the drive control complicated.

Figure 11:
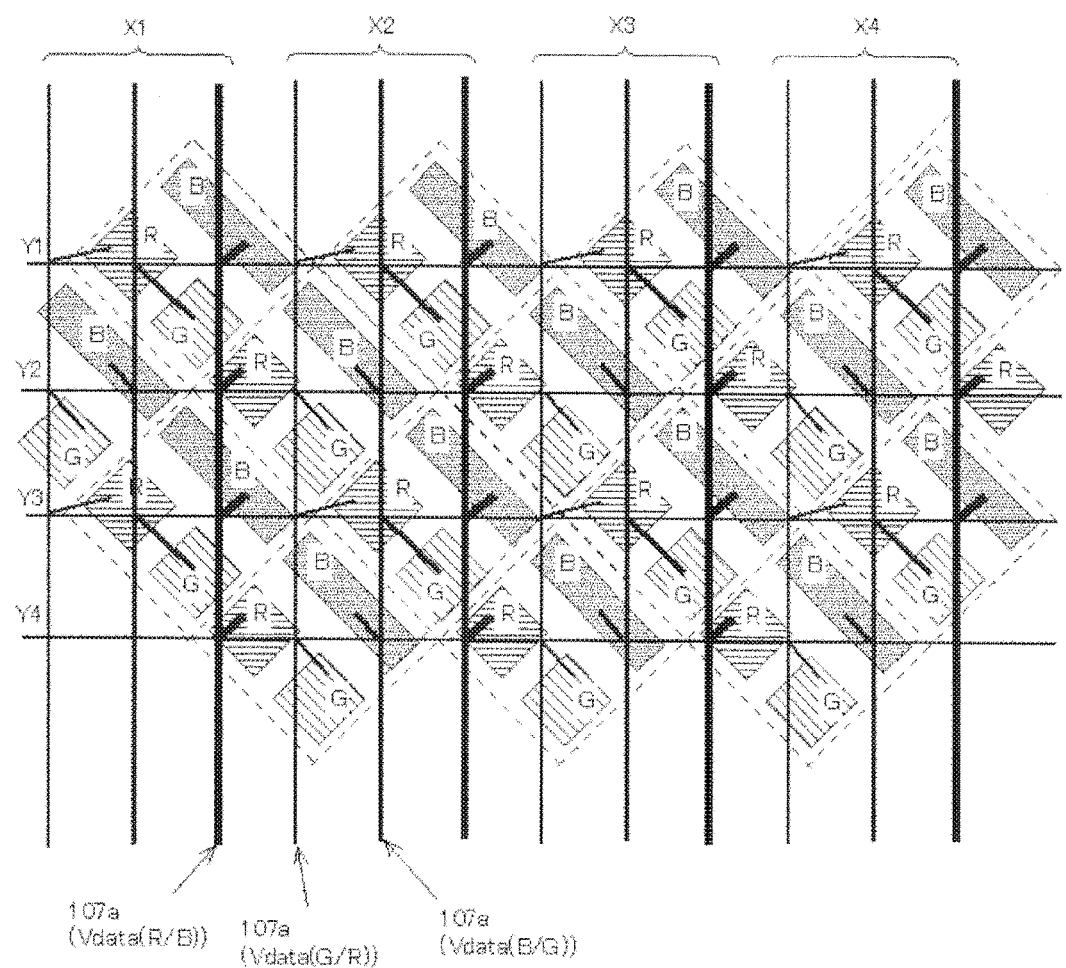
FIG. 11 is a layout diagram of subpixels and wirings in the first pixel arrangement structure.

Therefore, as illustrated in FIG. 11, the data line and the power supply line (only the data line is shown in FIG. 11 to facilitate the illustration and the line has a different thickness for each color) corresponding to the subpixel of each color is configured to extend in the up-down direction in FIG. 11 while the scanning line is configured to extend in the left-right direction in FIG. 11, while these wirings are connected to TFT (not illustrated) arranged at the crossing points thereof, to drive each subpixel. At that time, each data line is connected to subpixels of two colors, not only a subpixel of one color, so as to suppress the increase in the number of data lines to drive each subpixel.

More specifically, the data line 107a for R/B is connected to the subpixels of B for pixels in an odd-numbered column (Y1, Y3, . . . ), and is connected to the subpixels of R for pixels in an even-numbered column (Y2, Y4, . . . ). Furthermore, the data line 107a for G/R is connected to the subpixels of R for pixels in an odd-numbered column, and is connected to the subpixels of G for pixels in an even-numbered column. Moreover, the data line 107a for B/G is connected to the subpixels of G for pixels in an odd-numbered column, and is connected to the subpixels of B for pixels in an even-numbered column. Accordingly, while the layout in each of the RGB subpixels (light emitting regions) has a structure in which the pixel array in the S stripe arrangement is rotated, the power supply lines, the data lines and the scanning lines that are connected to the subpixels of RGB extend in the horizontal/vertical directions. Thus, it is possible to perform drive control similarly to that in the case of the S stripe arrangement. Furthermore, connecting a data line to subpixels of two colors may prevent the number of data lines from being increased, and thus increase the light emitting region of each subpixel.

While the pixel arrangement structure has been described in which the pixel array in the S stripe arrangement is rotated counterclockwise by 45 degrees, the pixel arrangement structure according to the present embodiment displays an image not only by subpixels in each pixel but by combinations of subpixels in adjacent pixels, as will be described later. Thus, the light emitting regions in subpixels of different colors may be displaced from one another so as to smoothly display a specified image. For example, as illustrated in FIG. 12, with respect to the diagonal direction at an angle of 45 degrees from the upper left to the lower right (downward sloping direction), the subpixels of R and the subpixels of G may be shifted in the lower right direction. Such a pixel arrangement structure is referred to as the second pixel arrangement structure. In the second pixel arrangement structure, though a unit pixel has the shape of a rectangle and the subpixel of G is off the edge of the rectangle, the shape of a unit pixel here is a convenient shape for illustrating the relationship between adjacent pixels. In the case where the shape is defined by a component of the TFT substrate, the shape is formed to include all subpixels.

Figure 13:
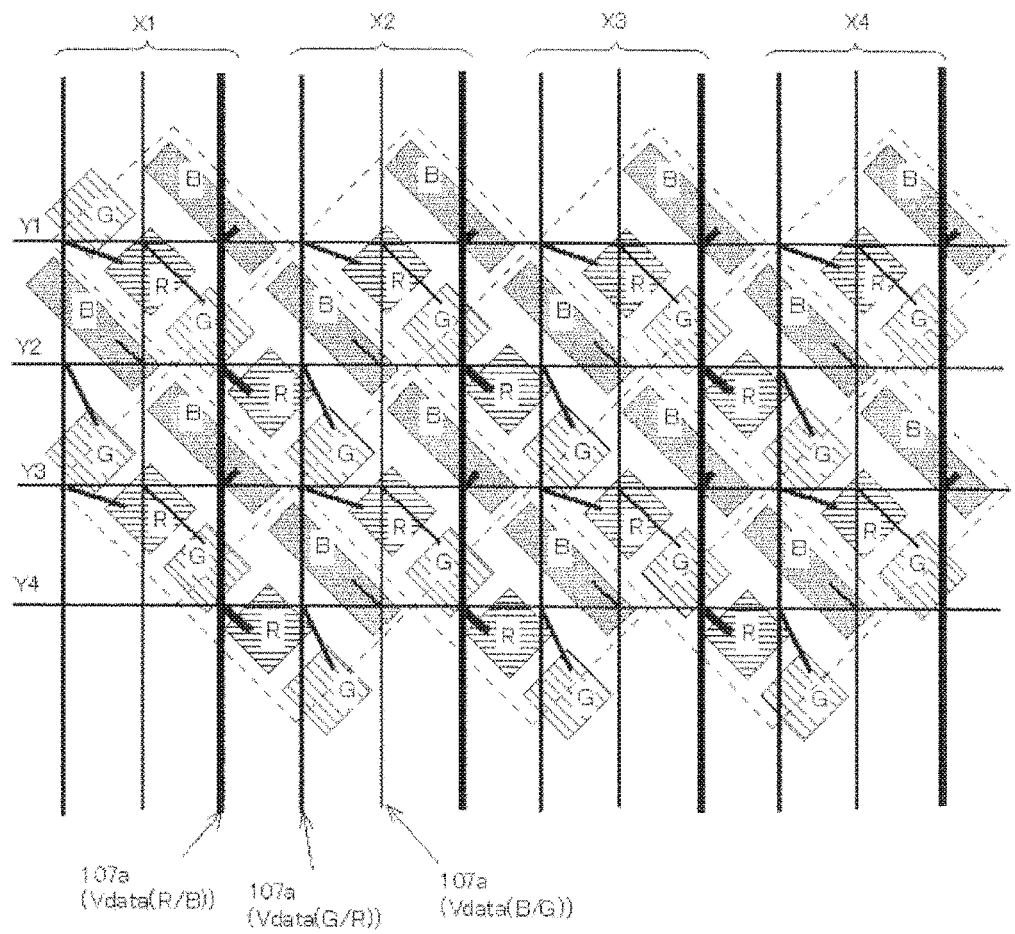
FIG. 13 is a layout diagram of subpixels and wirings in the second pixel arrangement structure.

In this case also, as illustrated in FIG. 13, the data line and the power supply line (the power supply line is not illustrated) corresponding to the subpixels of each color extend in the up-down direction of FIG. 13, the scanning line corresponding to the subpixels of each color extends in the left-right direction, these wirings being connected to the TFT (not illustrated) arranged at crossing points thereof to drive each subpixel. Moreover, connection of each data line not only to the subpixel of one color but to the subpixels of two colors may suppress the increase in the number of data lines for driving each subpixel. Such a layout of subpixels and wirings enable drive control similar to that in the S stripe arrangement, which may increase the size of the light emitting region of each subpixel.

The arrangements and shapes of RGB subpixels in FIGS. 10 to 13 are mere examples and may appropriately be modified. For example, though FIGS. 10 and 11 show the pixel arrangement structure in which the pixel array in the S stripe arrangement is rotated counterclockwise at an angle of 45 degrees, the pixel array in the S stripe arrangement, in the pixel arrangement structure according to the present embodiment, may be inclined at an arbitrary angle, for example, rotated clockwise by 45 degrees, rotated clockwise (counterclockwise) by 30 or 60 degrees. Moreover, though the subpixels of R and the subpixels of G are shifted in the lower right direction in FIGS. 12 and 13, the subpixels of R and the subpixels of G may also be shifted in the upper left direction. In addition, the arrangement of each subpixel of RGB may appropriately be changed, and the positions of the subpixel of R and the subpixel of G may be switched, or the positions of the subpixels of R and G and the position of the subpixel of B may be switched. Furthermore, in FIGS. 10 to 13, each of the light emitting regions for RGB has the shape of a rectangle, the shape of a hexagon, an octagon, a circle, an ellipse or the like may also be employed.

In the case of the pixel arrangement structure in FIGS. 10 and 12, pixels extend in the diagonal direction at an angle of 45 degrees, the pitch in the X and Y directions between diagonally adjacent pixels correspond to 1/2½ (i.e. 0.707 times), which can raise the resolution in the X and Y directions to 2½ (i.e. 1.414 times). However, an image including a line extending in the horizontal/vertical directions is displayed in such a pixel arrangement structure, when pixels are turned on in a zig-zag manner, the boundary of an image cannot smoothly be displayed. Thus, in order to avoid this problem, the drive patterns of pixels are categorized into seven patterns according to the combination of subpixels to be turned on, display data is analyzed to detect the boundary of an image to be displayed, a combination of patterns corresponding to multiple pixels near the boundary of the image is decided according to the image to be displayed, and multiple pixels are driven with the decided combination of patterns, to smoothly display the boundary of an image in the horizontal/vertical directions.

Figure 14:
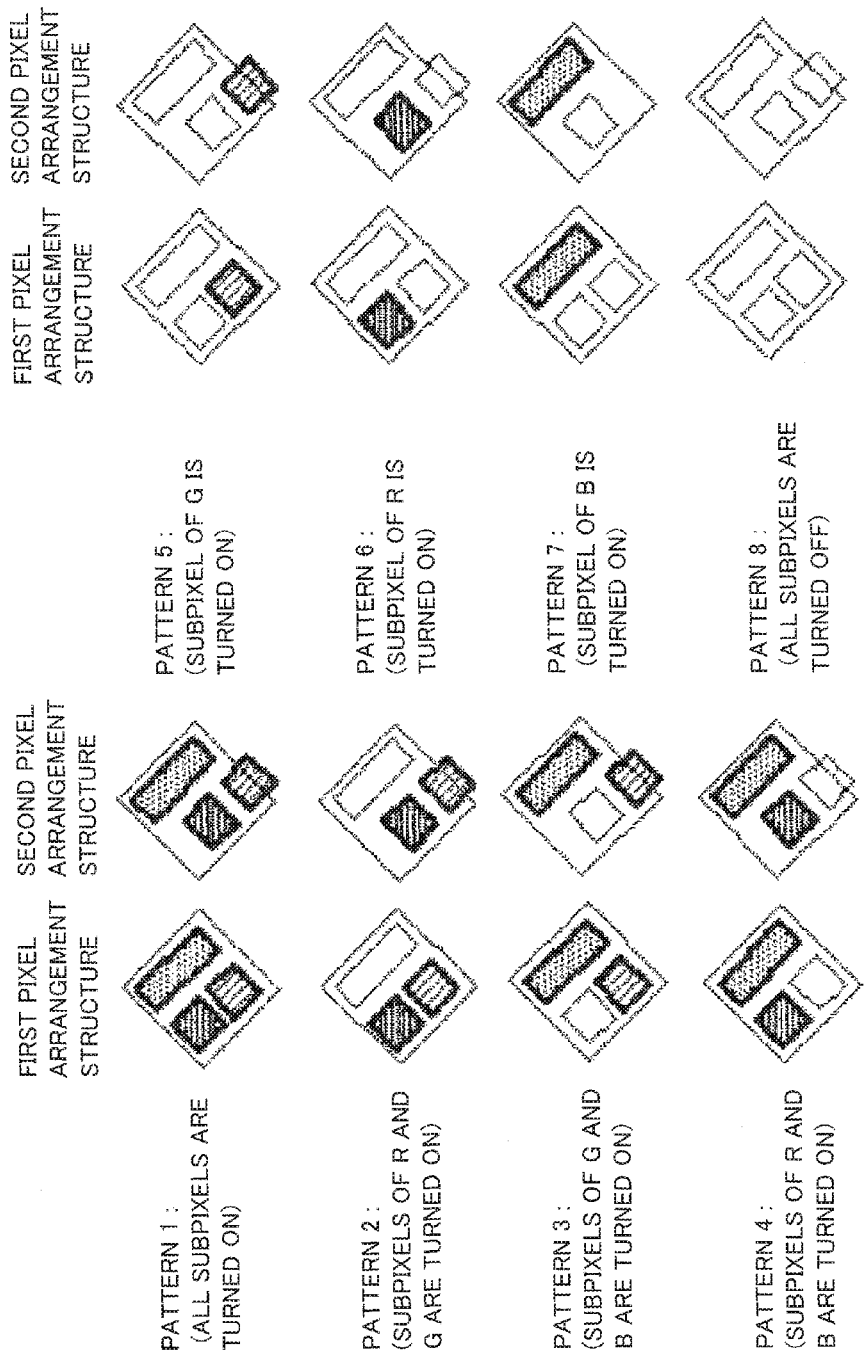
FIG. 14 is a plan view illustrating display patterns of image in the pixel arrangement structure according to an embodiment.

More specifically, as illustrated in FIG. 14, for the first pixel arrangement structure and the second pixel arrangement structure, the drive patterns of pixels are categorized into seven patterns (eight patterns as necessary, additionally including a pattern 8 in which all the subpixels of RGB are turned off), including a pattern 1 in which all the subpixels of RGB are turned on, patterns in which two of the three subpixels of RGB are turned on (pattern 2 in which the subpixels of R and G are turned on, pattern 3 in which the subpixels of G and B are turned on, pattern 4 in which the subpixels of R and B are turned on), patterns in which one of the three subpixels of RGB is turned on (pattern 5 in which only the subpixel of G is turned on, pattern 6 in which only the subpixel of R is turned on, pattern 7 in which only the subpixel of B is turned on). A combination of patterns is decided depending on an image to be displayed, thereby making it possible to smoothly display the boundaries of various images.

FIGS. 15 to 21 illustrate combinations of patterns in the case where various images are displayed when pixels of sixteen columns (x1 to x16) are arranged in the vertical direction and pixels of sixteen rows (y1 to y16) are arranged in the horizontal direction. It is to be noted that the positions of pixels are indicated by lower-case characters of x and y in FIGS. 15 to 21 so as to distinguish such columns and rows from the indications of the data lines and the scanning lines in FIGS. 11 and 13.

Figure 15:
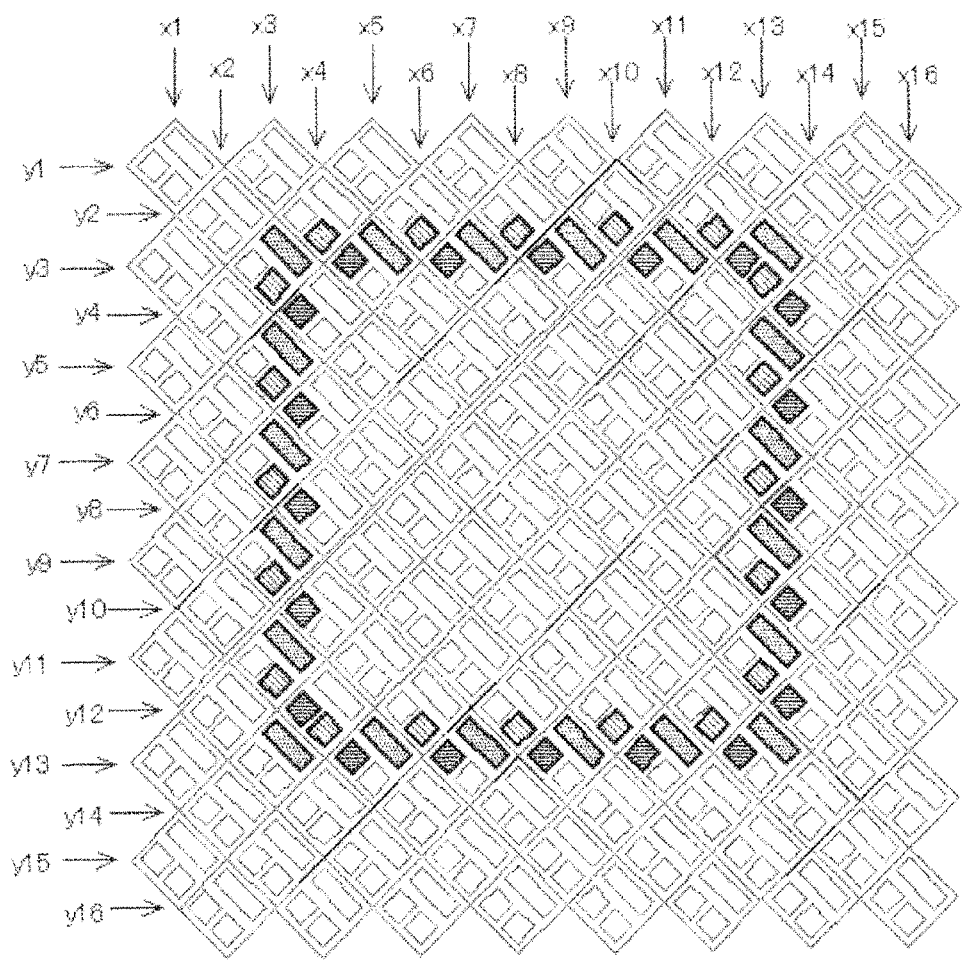
FIG. 15 is a plan view illustrating a display example of image (white frame in which subpixel of B is located at upper left corner) in the pixel arrangement structure according to an embodiment.

FIG. 15 illustrates a combination example of patterns in the case where an image of an outline rectangle (white frame) when a subpixel of B is located at the upper left corner is displayed. In this case, using the first pixel arrangement structure illustrated in FIG. 10, for the upper side, with respect to two pixels contiguous in the right-downward sloping direction (only the upper left pixel at the right end), the upper left pixels (five pixels corresponding to (x4, y2), (x6, y2), (x8, y2), (x10, y2), (x12, y2)) are turned on in the pattern 5 where only the subpixels of G are turned on, while the lower right pixels (four pixels corresponding to (x5, y3), (x7, y3), (x9, y3), (x11, y3)) are turned on in the pattern 4 where the subpixels of R and B are turned on. Moreover, for the upper right corner, the pixel corresponding to (x13, y3) is turned on in the pattern 1 where all the subpixels of RGB are turned on. Furthermore, for the right side, with respect to two pixels contiguous in the right-upward sloping direction (only the upper right pixel at the lower end), upper right pixels (five pixels corresponding to (x14, y4), (x14, y6), (x14, y8), (x14, y10), (x14, y12)) are turned on in the pattern 6 where only the subpixels of R are turned on, while the lower left pixels (four pixels corresponding to (x13, y5), (x13, y7), (x13, y9), (x13, y11)) are turned on in the pattern 3 where the subpixels of G and B are turned on. Moreover, for the lower side, with respect to two pixels contiguous in the right-downward sloping direction (only the lower right pixel at the left end), lower right pixels (five pixels corresponding to (x13, y13), (x11, y13), (x9, y13), (x7, y13), (x5, y13)) are turned on in the pattern 4 where the subpixels of R and B are turned on, while upper left pixels (four pixels corresponding to (x12, y12), (x10, y12), (x8, y12), (x6, y12)) are turned on in the pattern 5 where only the subpixels of G are turned on. Furthermore, for the lower left corner, the pixel corresponding to (x3, y13) is turned on in the pattern 7 where only the subpixel of B is turned on, while the pixel corresponding to (x4, y12) is turned on in the pattern 2 where the subpixels of R and G are turned on. Moreover, for the left side, with respect to two pixels contiguous in the right-upward sloping direction (only the lower left pixel at the upper end), lower left pixels (five pixels corresponding to (x3, y11), (x3, y9), (x3, y7), (x3, y5), (x3, y3)) are turned on in the pattern 3 where the subpixels of G and B are turned on, while upper right pixels (four pixels corresponding to (x4, y10), (x4, y8), (x4, y6), (x4, y4)) are turned on in the pattern 6 where only the subpixel of R is turned on. That is, using the patterns 1 to 7 illustrated in FIG. 14, a white frame with B located at the upper left corner is displayed.

Figure 16:
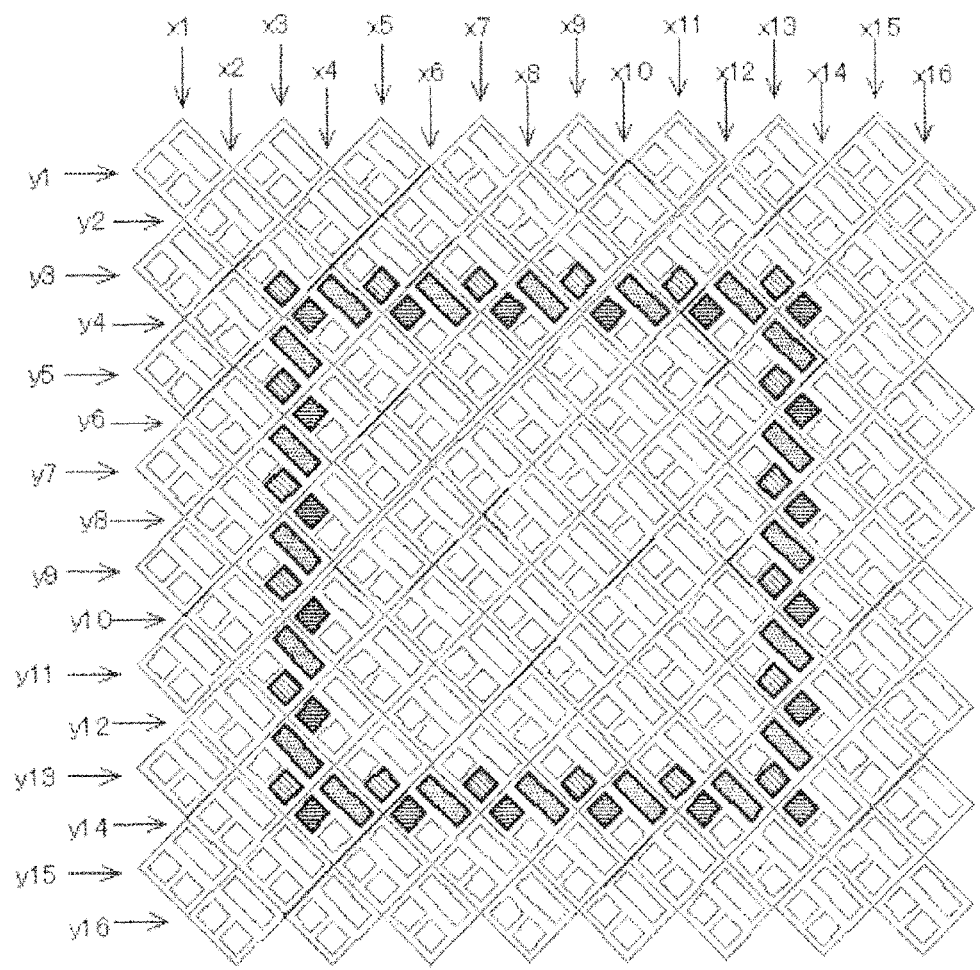
FIG. 16 is a plan view illustrating a display example of image (white frame in which subpixel of G is located at upper left corner) in the pixel arrangement structure according to an embodiment.

FIG. 16 illustrates a combination example of patterns in the case where a white frame image when a subpixel of G is located at the upper left corner is displayed. In this case, similarly to the above-described example, using the first pixel arrangement structure illustrated in FIG. 10, for the upper side, with respect to two pixels contiguous in the right-downward sloping direction (only the upper left pixel at the right end), upper left pixels (six pixels corresponding to (x3, y3), (x5, y3), (x7, y3), (x9, y3), (x11, y3), (x13, y3)) are turned on in the pattern 5 where only the subpixels of G are turned on, while lower right pixels (five pixels corresponding to (x4, y4), (x6, y4), (x8, y4), (x10, y4), (x12, y4)) are turned on in the pattern 4 where the subpixels of R and B are turned on. Moreover, for the right side, with respect to the two pixels contiguous in the right-upward sloping direction (only the upper right pixel at the lower end), upper right pixels (six pixels corresponding to (x14, y4), (x14, y6), (x14, y8), (x14, y10), (x14, y12), (x14, y14)) are turned on in the pattern 6 where the subpixels of R are turned on, while lower left pixels (five pixels corresponding to (x13, y5), (x13, y7), (x13, y9), (x13, y11), (x13, y13)) are turned on in the pattern 3 where the subpixels of G and B are turned on. Furthermore, for the lower side, with respect to two pixels contiguous in the right-downward sloping direction (only the lower right pixel at the left end), lower right pixels (five pixels corresponding to (x12, y14), (x10, y14), (x8, y14), (x6, y14), (x4, y14)) are turned on in the pattern 4 where the subpixels of R and B are turned on, while upper left pixels (four pixels corresponding to (x11, y13), (x9, y13), (x7, y13), (x5, y13)) are turned on in the pattern 5 where only the subpixels of G are turned on. Moreover, for the left side, with respect to two pixels contiguous in the right-upward sloping direction (only the lower left pixel at the upper end), lower left pixels (five pixels corresponding to (x3, y13), (x3, y11), (x3, y9), (x3, y7), (x3, y5)) are turned on in the pattern 3 where the subpixels of G and B are turned on, while upper right pixels (four pixels corresponding to (x4, y12), (x4, y10), (x4, y8), (x4, y6)) are turned on in the pattern 6 where only the subpixels of R are turned on. That is, using the patterns 3, 4, 5 and 6 illustrated in FIG. 14, a white frame with G located at the upper left corner is displayed.

Figure 17:
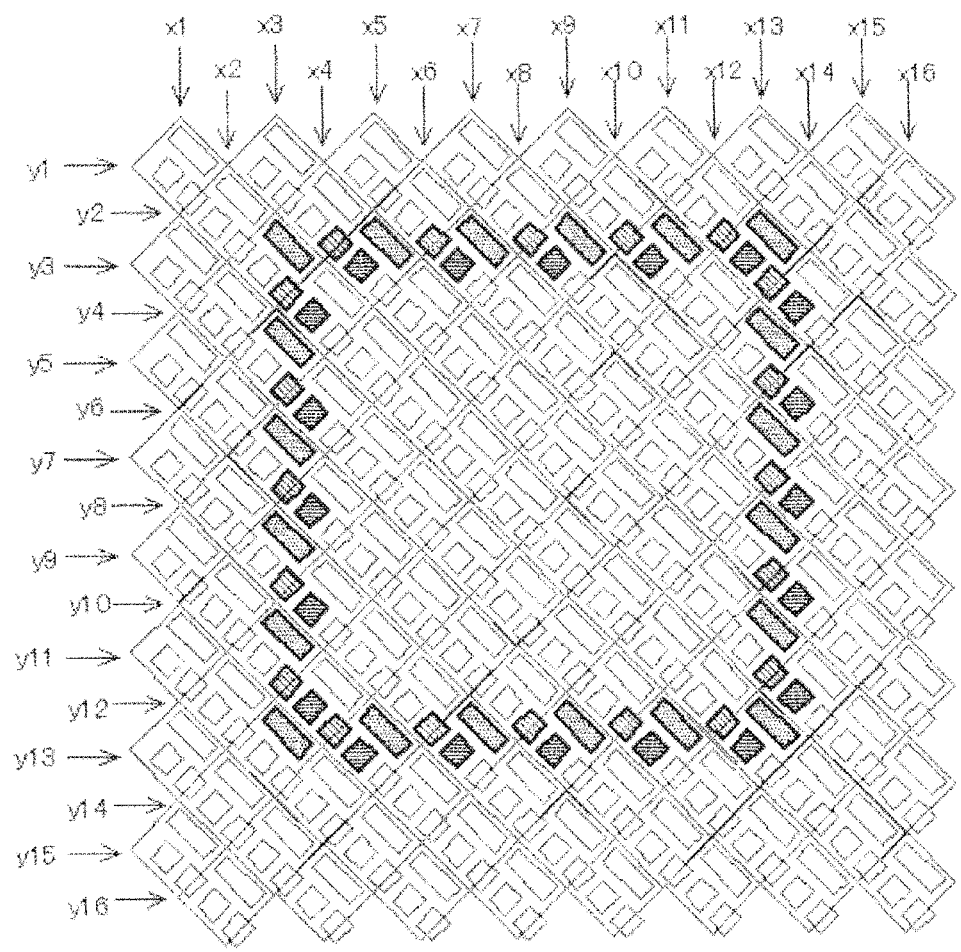
FIG. 17 is a plan view illustrating a display example of image (white frame in which subpixels of B are located at corners) in the pixel arrangement structure according to an embodiment.

FIG. 17 illustrates a combination example of patterns in the case where a white frame image when the subpixels of B are located at corners is displayed. In this case, using the second pixel arrangement structure illustrated in FIG. 12, for the upper side, with respect to two pixels contiguous in the right-downward sloping direction (only the upper left pixel at the right end), upper left pixels (five pixels corresponding to (x4, y2), (x6, y2), (x8, y2), (x10, y2), (x12, y2)) are turned on in the pattern 5 where only the subpixels of G are turned on, while lower right pixels (four pixels corresponding to (x5, y3), (x7, y3), (x9, y3), (x11, y3)) are turned on in the pattern 4 where the subpixels of R and B are turned on. Moreover, for the upper right corner, the pixel corresponding to (x13, y3) is turned on in the pattern 1 where all the subpixels of RGB are turned on. Furthermore, for the right side, with respect to two pixels contiguous in the right-upward sloping direction (only the upper right pixel at the lower end), upper right pixels (five pixels corresponding to (x14, y4), (x14, y6), (x14, y8), (x14, y10), (x14, y12)) are turned on in the pattern 6 where only the subpixels of R are turned on, while lower left pixels (four pixels corresponding to (x13, y5), (x13, y7), (x13, y9), (x13, y11)) are turned on in the pattern 3 where the subpixels of G and B are turned on. Moreover, for the lower side, with respect to two pixels contiguous in the right-downward sloping direction (only the lower right pixel at the left end), lower right pixels (five pixels corresponding to (x13, y13), (x11, y13), (x9, y13), (x7, y13), (x5, y13)) are turned on in the pattern 4 where the subpixels of R and B are turned on, while upper left pixels (four pixels corresponding to (x12, y12), (x10, y12), (x8, y12), (x6, y12)) are turned on in the pattern 5 where only the subpixels of G are turned on. Furthermore, for the lower left corner, the pixel corresponding to (x3, y13) is turned on in the pattern 7 where only the subpixels of B are turned on, while the pixel corresponding to (x4, y12) is turned on in the pattern 2 where the subpixels of R and G are turned on. Moreover, for the left side, with respect to two pixels contiguous in the right-upward sloping direction (only the lower left pixel at the upper end), lower left pixels (five pixels corresponding to (x3, y11), (x3, y9), (x3, y7), (x3, y5), (x3, y3)) are turned on in the pattern 3 where the subpixels of G and B are turned on, while upper right pixels (four pixels corresponding to (x4, y10), (x4, y8), (x4, y6), (x4, y4)) are turned on in the pattern 6 where only the subpixels of R are turned on. That is, using the patterns 1 to 7 illustrated in FIG. 14, a white frame with B located at corners is displayed.

Figure 18:
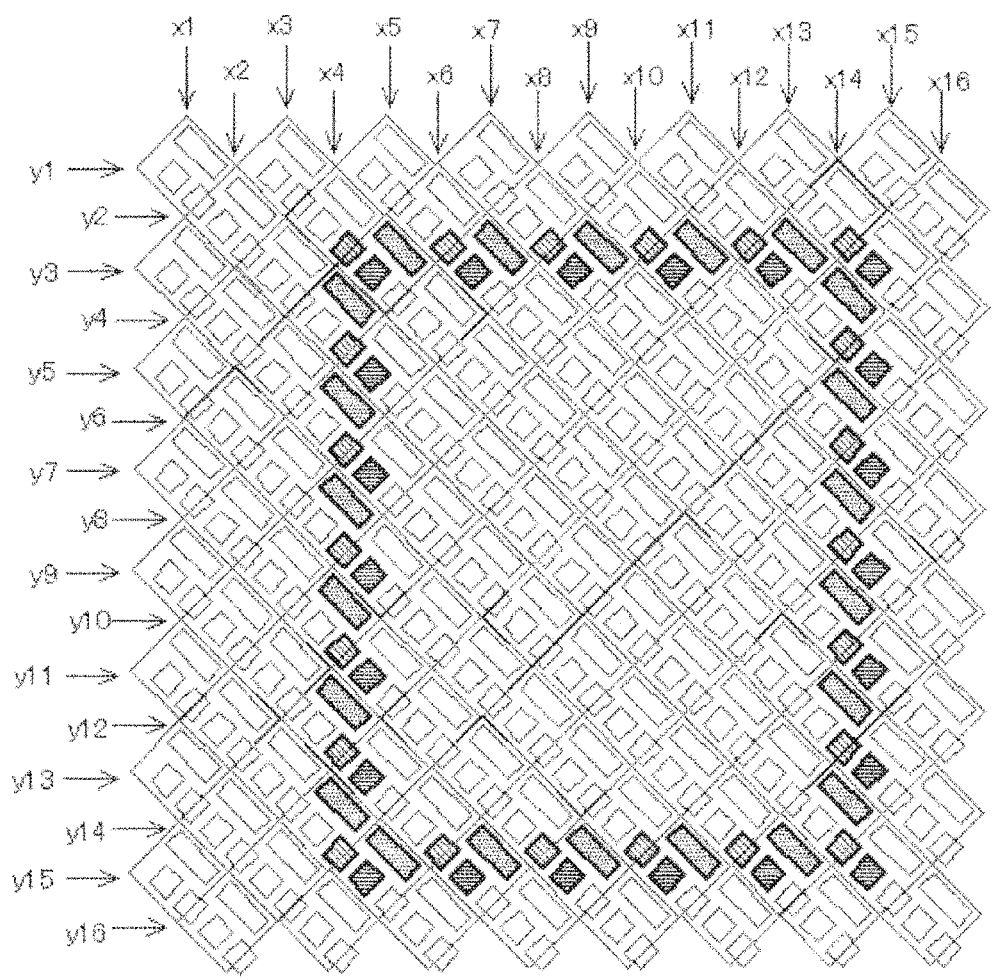
FIG. 18 is a plan view illustrating a display example of image (white frame in which subpixels of G are located at corners) in the pixel arrangement structure according to an embodiment.

FIG. 18 illustrates a combination example of patterns in the case where a white frame image when the subpixels of G are located at corners is displayed. In this case, similarly to the above-described example, using the second pixel arrangement structure illustrated in FIG. 12, for the upper side, with respect to two pixels contiguous in the right-downward sloping direction (only the upper left pixel at the right end), upper left pixels (six pixels corresponding to (x4, y2), (x6, y2), (x8, y2), (x10, y2), (x12, y2), (x14, y2)) are turned on in the pattern 5 where only the subpixels of G are turned on, while lower right pixels (five pixels corresponding to (x5, y3), (x7, y3), (x9, y3), (x11, y3), (x13, y3)) are turned on in the pattern 4 where the subpixels of R and B are turned on. Moreover, for the right side, with respect to two pixels contiguous in the right-upward sloping direction (only the upper right pixel at the lower end), upper right pixels (seven pixels corresponding to (x15, y3), (x15, y5), (x15, y7), (x15, y9), (x15, y11), (x15, y13), (x15, y15)) are turned on in the pattern 6 where only the subpixels of R are turned on, while lower left pixels (six pixels corresponding to (x14, y4), (x14, y6), (x14, y8), (x14, y10), (x14, y12), (x14, y14)) are turned on in the pattern 3 where the subpixels of G and B are turned on. Furthermore, for the lower side, with respect to two pixels contiguous in the right-downward sloping direction (only the lower right pixel at the left end), lower right pixels (five pixels corresponding to (x13, y15), (x11, y15), (x9, y15), (x7, y15), (x5, y15)) are turned on in the pattern 4 where the subpixels of R and B are turned on, upper left pixels (four pixels corresponding to (x12, y14), (x10, y14), (x8, y14), (x6, y14)) are turned on in the pattern 5 where only the subpixels of G are turned on. Moreover, for the left side, with respect to two pixels contiguous in the right-upward sloping direction (only the lower left pixel at the upper end), lower left pixels (six pixels corresponding to (x4, y14), (x4, y12), (x4, y10), (x4, y8), (x4, y6), (x4, y4)) are turned on in the pattern 3 where the subpixels of G and B are turned on, while upper right pixels (five pixels corresponding to (x5, y13), (x5, y11), (x5, y9), (x5, y7), (x5, y5)) are turned on in the pattern 6 where only the subpixels of R are turned on. That is, using the patterns 3, 4, 5 and 6 illustrated in FIG. 14, a white frame with G located at corners is displayed. Furthermore, using the second pixel arrangement structure illustrated in FIG. 12, the position of G may be closer to the center of two contiguous pixels, which can enhance the visibility.

Figure 19:
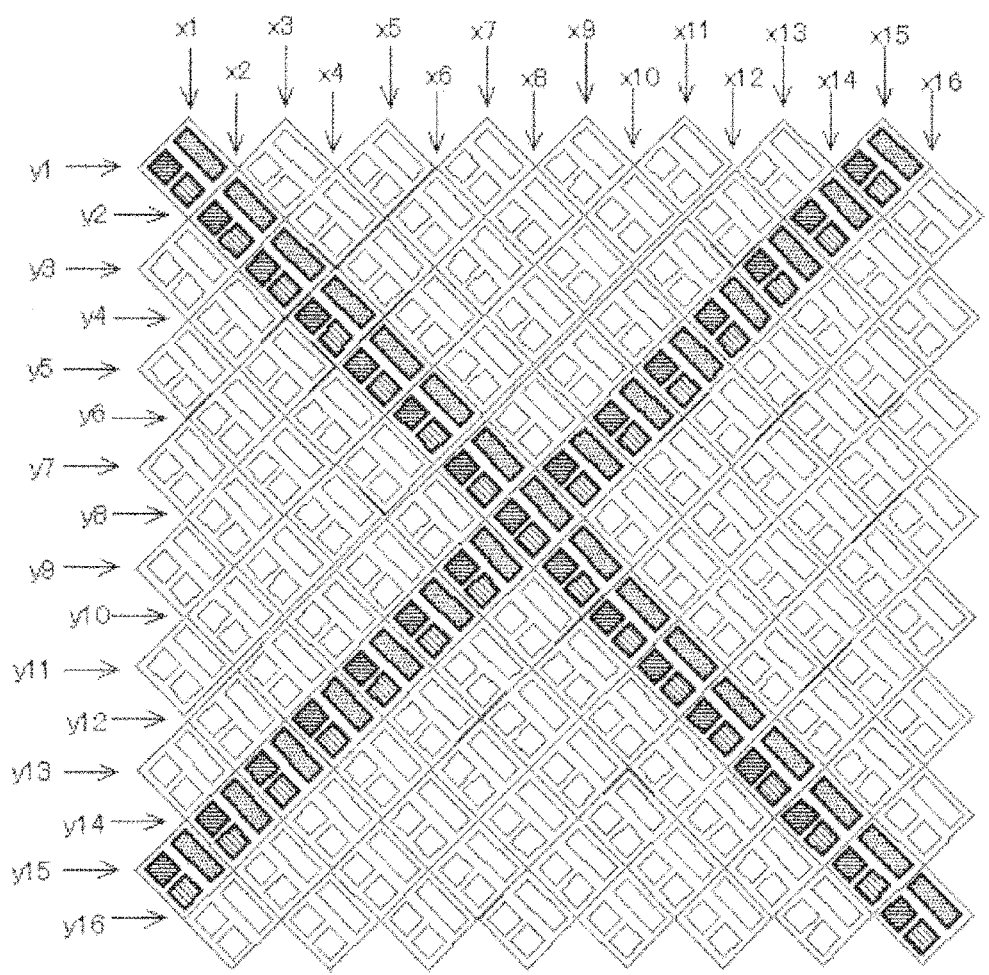
FIG. 19 is a plan view illustrating a display example of image (white diagonal lines at angle of 45 degrees) in the pixel arrangement structure according to an embodiment.
Figure 20:
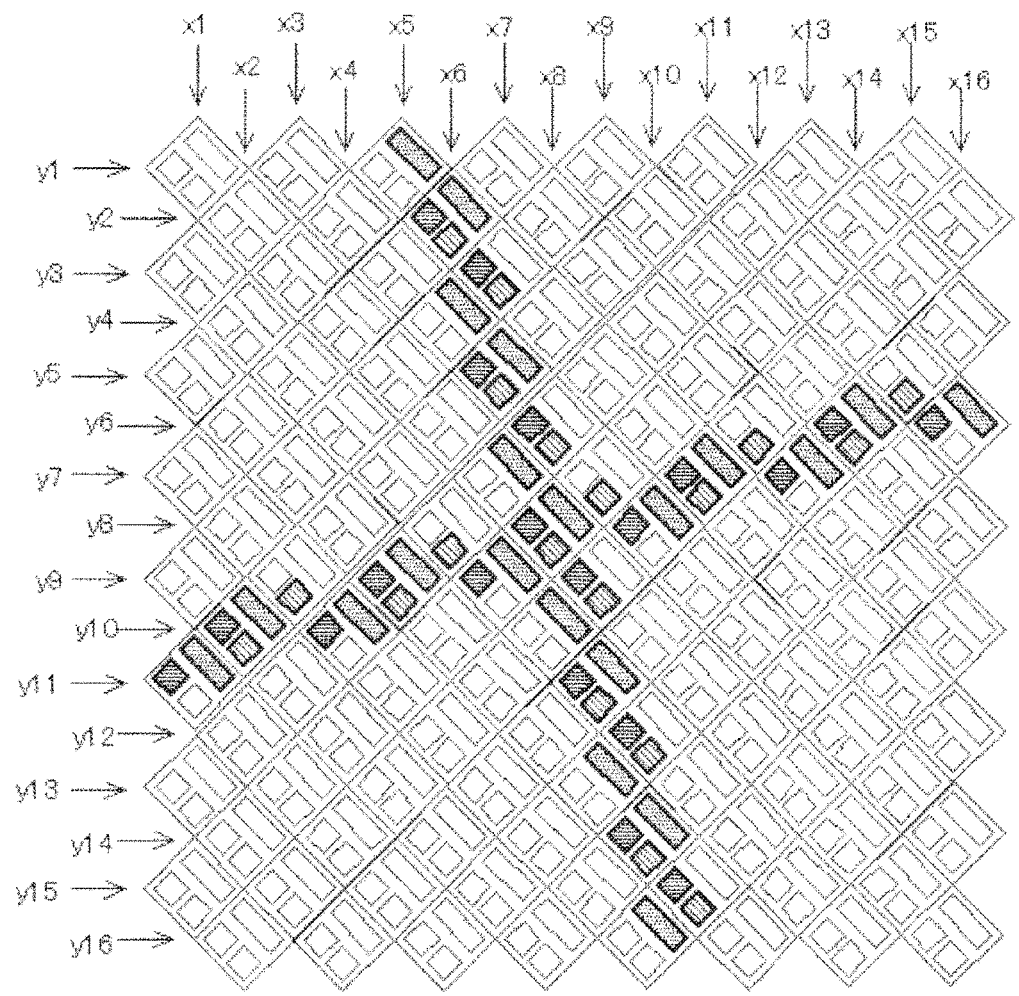
FIG. 20 is a plan view illustrating a display example of image (white diagonal lines at angle other than 45 degrees) in the pixel arrangement structure according to an embodiment.
Figure 21:
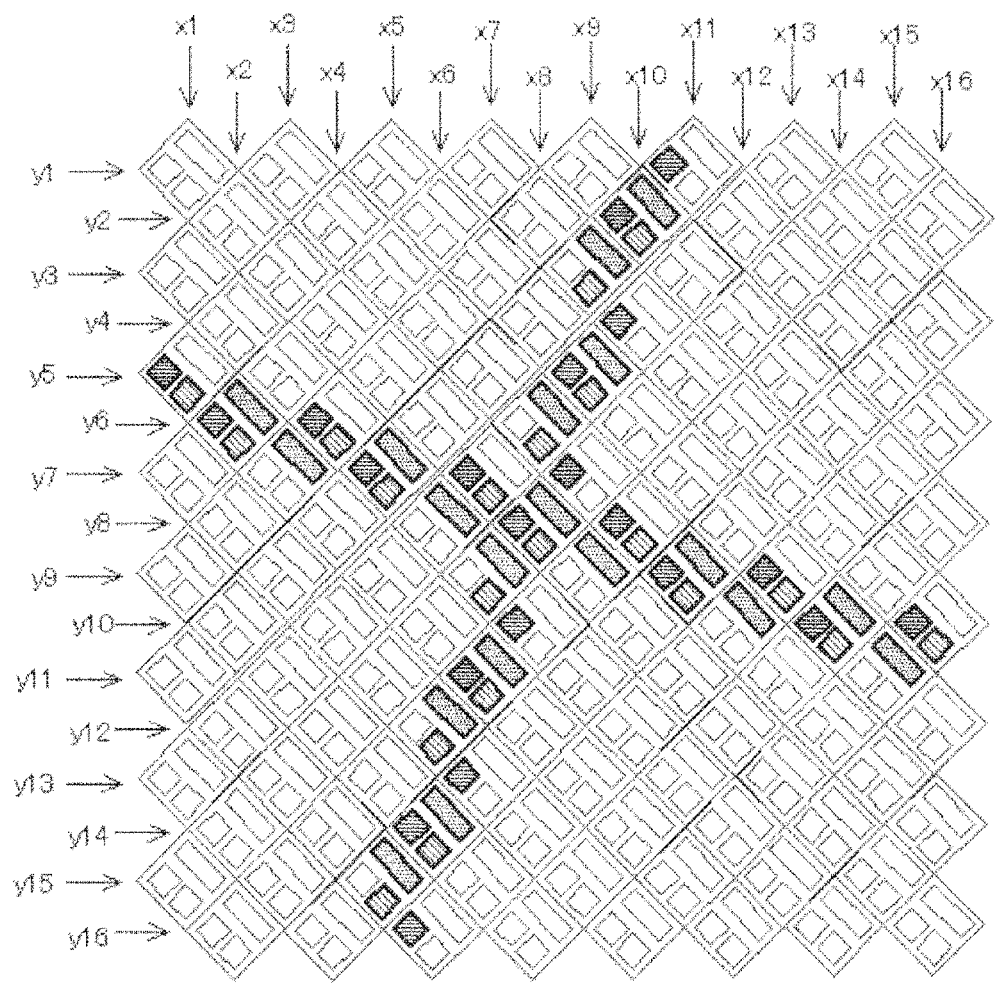
FIG. 21 is a plan view illustrating a display example of image (white diagonal lines at a different angle) in the pixel arrangement structure according to an embodiment.

FIGS. 15 to 18 illustrate the case where straight lines extending in the horizontal/vertical directions are displayed, while FIGS. 19 to 21 illustrate the case where diagonal lines are displayed. FIG. 19 illustrates a combination example of patterns in the case where white diagonal lines at the angle of 45 degrees are displayed. In this case, using the first pixel arrangement structure illustrated in FIG. 10, for both of a right-downward sloping diagonal line and a right-upward sloping diagonal line, each pixel is turned on in the pattern 1 where all the subpixels of RGB are turned on.

FIG. 20 illustrates a combination example of patterns in the case where white diagonal lines inclined at an angle other than 45 degrees are displayed. In this case, similarly to the above-described example, the first pixel arrangement structure illustrated in FIG. 10 is used, for a right-downward sloping diagonal line, with respect to three pixels contiguous in the right-downward sloping direction, assuming that m is a positive number, upper left pixels (pixels corresponding to (x5, y1), (x6, y4), . . . , i.e. (x(m+4), y(3m−2)) are turned on in the pattern 7 where only the subpixels of B are turned on, middle pixels (pixels corresponding to (x6, y2), (x7, y5), . . . , i.e. (x(m+5), y(3m−1)) are turned on in the pattern 1 where all the subpixels of RGB are turned on, while lower right pixels (pixels corresponding to (x7, y3), (x8, y6), . . . , i.e. (x(m+2), y(3m)) are turned on in the pattern 2 where the subpixels of R and G are turned on. Moreover, for the right-upward sloping line, with respect to three pixels contiguous in the right-upward sloping direction, assuming that n is a positive number, lower left pixels (pixels corresponding to (x1, y11), (x4, y10), . . . , i.e. (x(3n−2), y(12−n)) are turned on in the pattern 4 where the subpixels of R and B are turned on, while middle pixels (pixels corresponding to (x2, y10), (x5, y9), . . . , i.e. (x(3n−1), y(11−n)) are turned on in the pattern 1 where all the subpixels of RGB are turned on, while upper right pixels (pixels corresponding to (x3, y9), (x6, y8), . . . , i.e. (x(3n), y(10−n)) are turned on in the pattern 5 where only the subpixels of G are turned on. That is, using the patterns 1, 2, 4, 5 and 7 illustrated in FIG. 14, diagonal white lines are displayed.

FIG. 21 further illustrates a combination example of patterns in the case where white diagonal lines inclined at a further different angle. In this case, similarly to the above-described example, using the first pixel arrangement structure illustrated in FIG. 10, for the right-upward sloping line, with respect to three pixels contiguous in the right-upward sloping direction, assuming that m is a positive number, lower left pixels (pixels corresponding to (x5, y15), (x6, y12), . . . , i.e. (x (m+4), y (18−3m)) are turned on in the pattern 3 where the subpixels of G and B are turned on, while the middle pixels (pixels corresponding to (x6, y14), (x7, y11), . . . , i.e. (x (m+5), y (17−3m)) are turned on in the pattern 1 where all the subpixels of RGB are turned on, while upper right pixels (pixels corresponding to (x7, y13), (x8, y10), . . . , i.e. (x (m+6), y (16−3m)) are turned on in the pattern 6 where only the subpixels of R are turned on. Moreover, for the right-downward sloping line, with respect to three pixels contiguous in the right-downward sloping direction, assuming that n is a positive number, upper left pixels (pixels corresponding to (x1, y5), (x4, y6), . . . , i.e. (x (3n−2), y (n+4)) are turned on in the pattern 2 where the subpixels of R and G are turned on, while the middle pixels (pixels corresponding to (x2, y6), (x5, y7), . . . , i.e. (x (3n−1), y (n+5)) are turned on in the pattern 1 where all the subpixels of RGB are turned on, while the lower right pixels (pixels corresponding to (x3, y7), (x6, y8), . . . , i.e. (x (3n), y (n+6)) are turned on in the pattern 7 where only the subpixels of B are turned on. That is, using the patterns 1, 2, 3, 6 and 7 illustrated in FIG. 14, diagonal white lines are displayed.

Accordingly, the drive patterns for pixels are categorized into seven patterns including the pattern 1 in which all subpixels of RGB are turned on, the patterns 2 to 4 in which two of the three subpixels of RGB are turned on, the patterns 5 to 7 in which one of the three subpixels of RGB are turned on, display data is analyzed to detect the boundary of an image to be displayed, a combination of patterns corresponding to multiple pixels near the boundary of an image is decided in accordance with the image to be displayed, and the multiple pixels are driven with the decided combination of patterns. Therefore, an image including a line extending in the horizontal/vertical direction can smoothly be displayed as well as a line at an arbitrary angle, and the display quality can be enhanced.

It is to be noted that FIGS. 15 to 21 are mere examples of images to be displayed. An image with an arbitrary shape may appropriately be displayed by combining patterns selected from the seven patterns according to the image.

First Example

Next, a pixel array and an electro optical device according to the first example will be described with reference to FIGS. 22 to 29.

While the pixel arrangement structure in the electro optical device (organic EL display device) has specifically been described in the embodiment as described above, the present example describes a method of manufacturing an organic EL display device including a pixel array having the pixel arrangement structure as described above. FIGS. 22, 24, 26 and 28 are plan views of one pixel with the pixel arrangement structure shown in FIG. 10, whereas FIGS. 23, 25, 27 and 29 are section views of specially extracting a TFT part, a retention capacitance part and a light emitting element illustrated in one subpixel for explanation purpose, corresponding to FIGS. 22, 24, 26 and 28.

Figure 22:
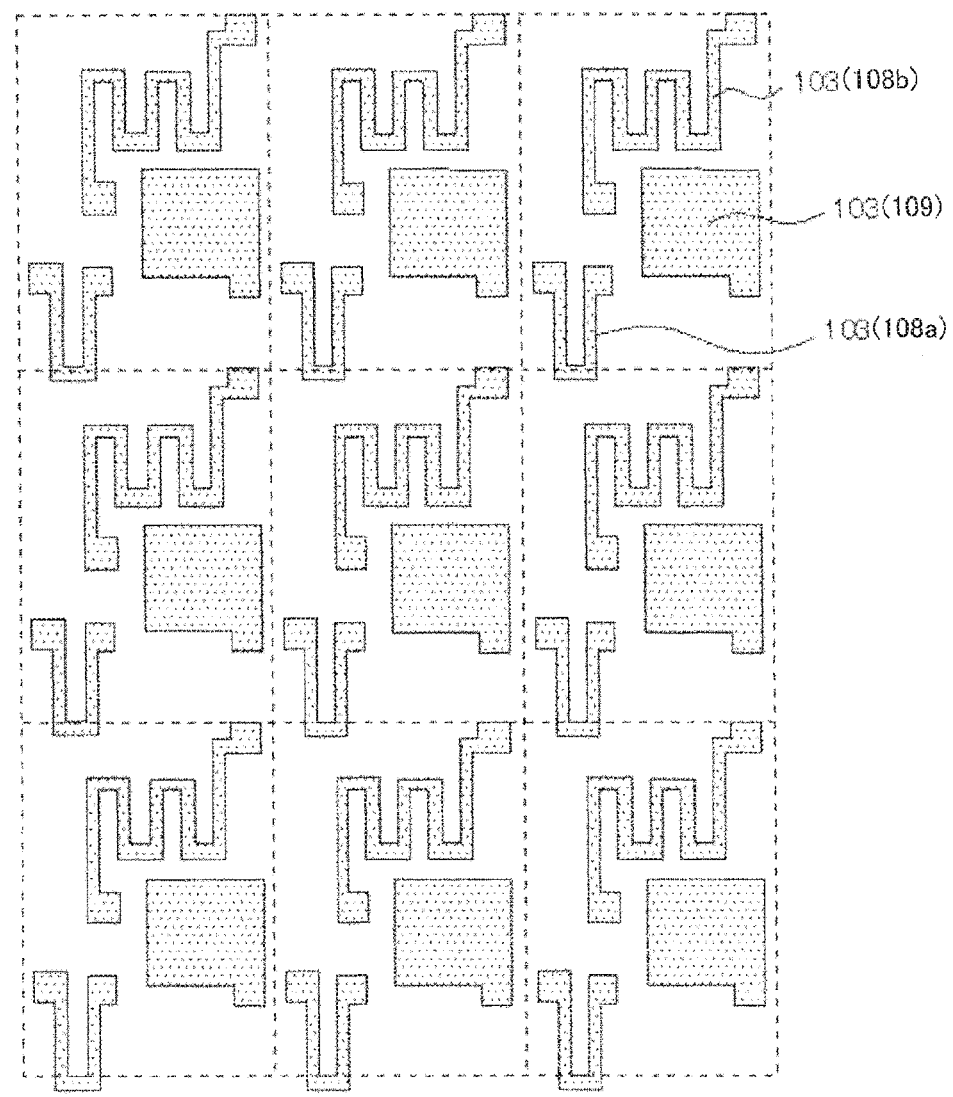
FIG. 22 is a plan view illustrating a manufacturing procedure (first step) of an organic EL display device according to the first example.
Figure 23:
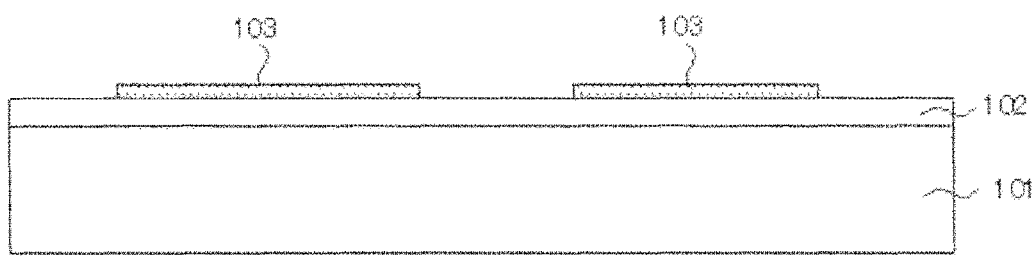
FIG. 23 is a section view illustrating a manufacturing procedure (first step) of an organic EL display device according to the first example, specially extracting a TFT part, a retention capacitor and a light emitting element illustrated in one subpixel for explanation purpose, corresponding to FIG. 22.

First, as illustrated in FIGS. 22 and 23, an underlying insulation film 102 is formed by depositing, for example, a silicon nitride film using, for example, chemical vapor deposition (CVD) method on a translucent substrate made of glass or the like (glass substrate 101). Next, a TFT part and a retention capacitance part are formed using a known low-temperature poly silicon TFT fabrication technique. More specifically, the CVD method or the like is used to deposit amorphous silicon, which is crystallized by excimer laser annealing (ELA) to form a poly silicon layer 103. Here, in order to secure a sufficient channel length of the M2 drive TFT 108b which is used as a voltage-to-current conversion amplifier to suppress variation in output current, and to enable the connection between the drain of the M1 switch TFT 108a and the data line 107a (FIG. 26), the connection between the source of the M1 switch TFT 108a and the C1 retention capacitance 109, the connection between the C1 retention capacitance 109 and the power supply line 107b (FIG. 26), the connection between the source of the M2 drive TFT 108b and the power supply line 107b, and the connection between the drain of the M2 drive TFT 108b and the anode electrode 111 of each subpixel, the poly silicon layer 103 is routed as illustrated.

Figure 24:
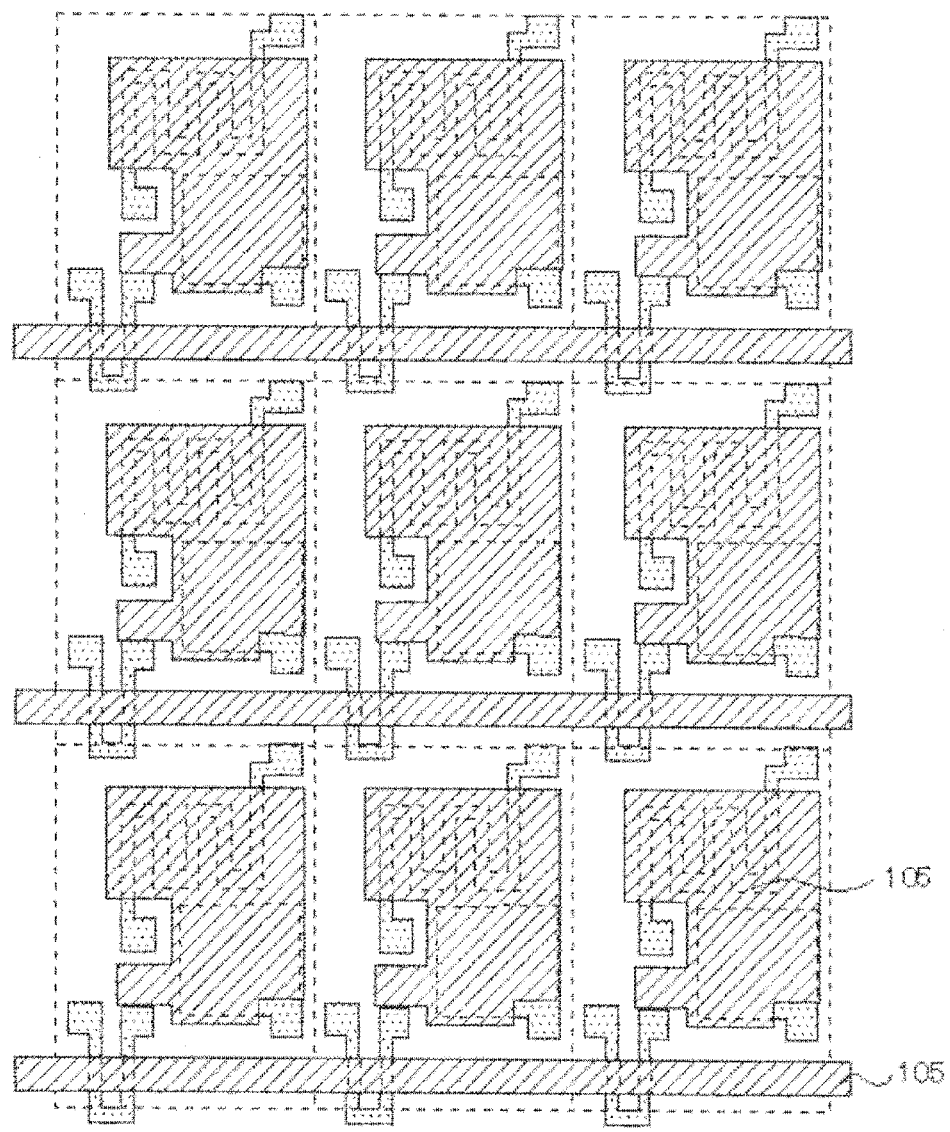
FIG. 24 is a plan view illustrating a manufacturing procedure (second step) of an organic EL display device according to the first example.
Figure 25:
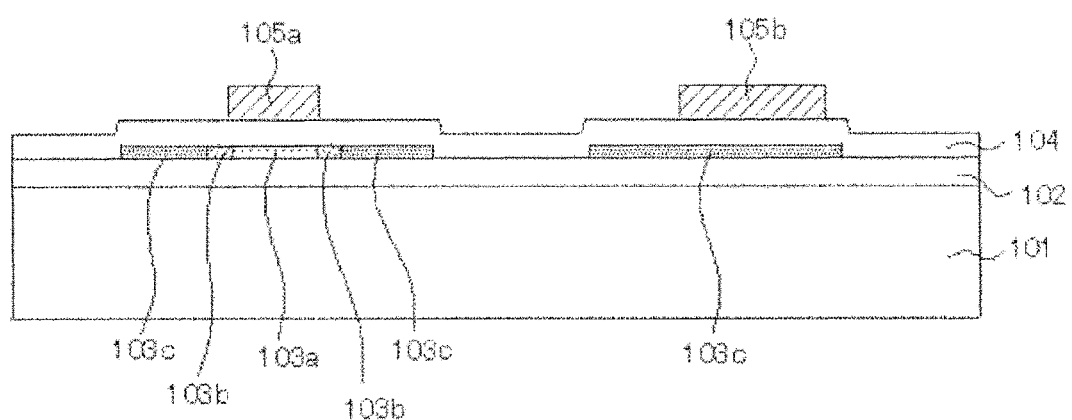
FIG. 25 is a section view illustrating a manufacturing procedure (second step) of an organic EL display device according to the first example, specially extracting a TFT part, a retention capacitor and a light emitting element illustrated in one subpixel for explanation purpose, corresponding to FIG. 24.

Next, as illustrated in FIGS. 24 and 25, a gate insulation film 104 is formed by depositing, for example, a silicon oxide film using the CVD method or the like on the poly silicon layer 103, and a gate electrode 105a and a retention capacitance electrode 105b are formed by further depositing, for example, molybdenum (Mo), niobium (Nb), tungsten (W) or an alloy thereof as the first metal layer 105 by the spattering technique. It is also possible to form the first metal layer 105 with a single layer of one substance selected from a group including, for example, Mo, W, Nb, MoW, MoNb, Al, Nd, Ti, Cu, Cu alloy, Al alloy, Ag and Ag alloy, or with a layered structure selected from a group including a two or more multi-layered structure of Mo, Cu, Al or Ag which is a low-resistance substance so as to reduce the interconnection resistance. Here, in order to increase the retention capacitance in each subpixel while facilitating the connection between the drain of the M1 switch TFT and the retention capacitance electrode 105b in each subpixel, the first metal layer 105 is formed to have the shape as illustrated. Next, additional impurity doping is applied to the poly silicon layer 103, which had been doped with a heavily-concentrated impurity layer (p+layer 103c) prior to formation of the gate electrode, using the gate electrode 105a as a mask to form a lightly-concentrated impurity layer (p−layer 103b) with an intrinsic layer (i layer 103a) being sandwiched, so as to form a lightly doped drain (LDD) structure in the TFT part.

Figure 26:
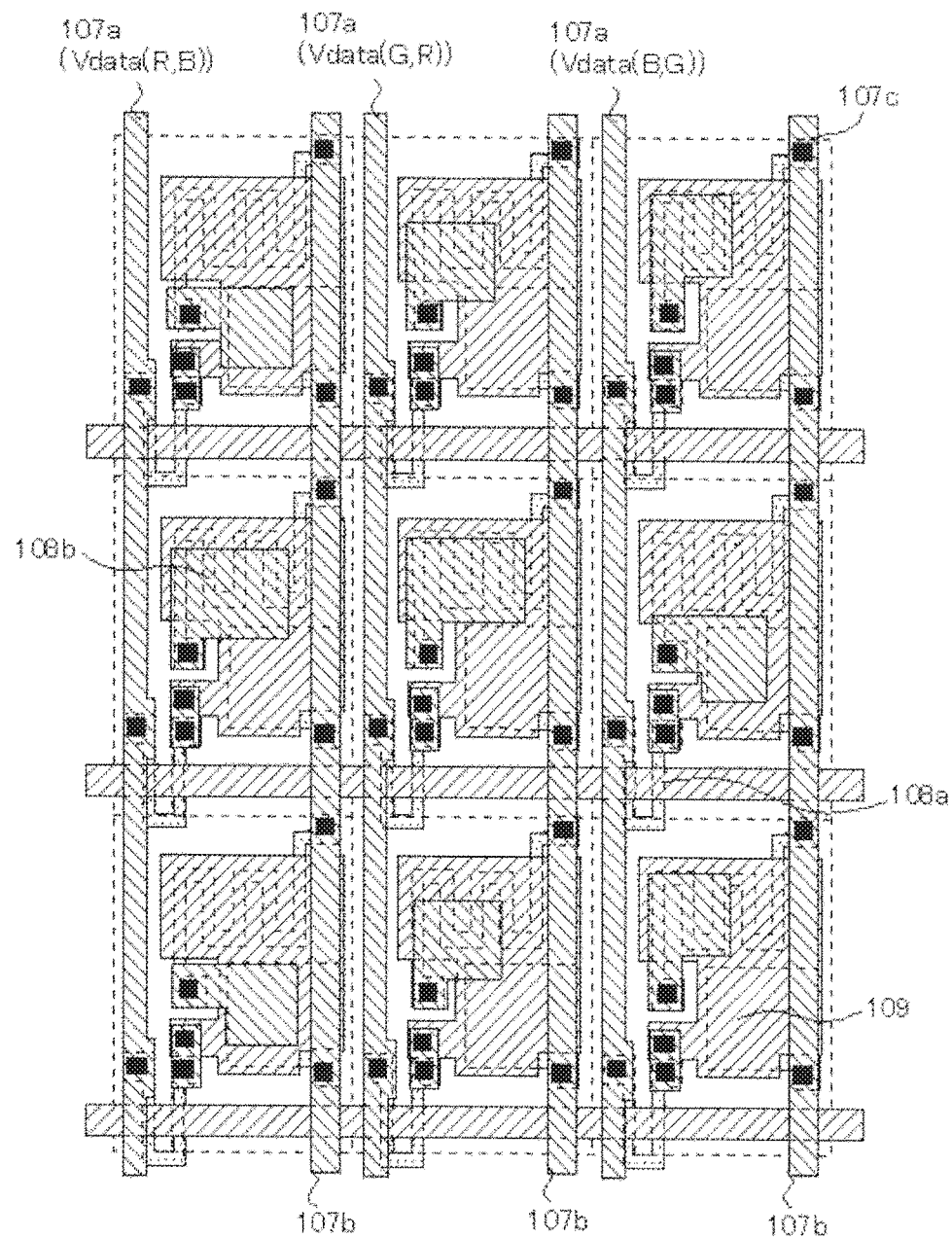
FIG. 26 is a plan view illustrating a manufacturing procedure (third step) of an organic EL display device according to the first example.
Figure 27:
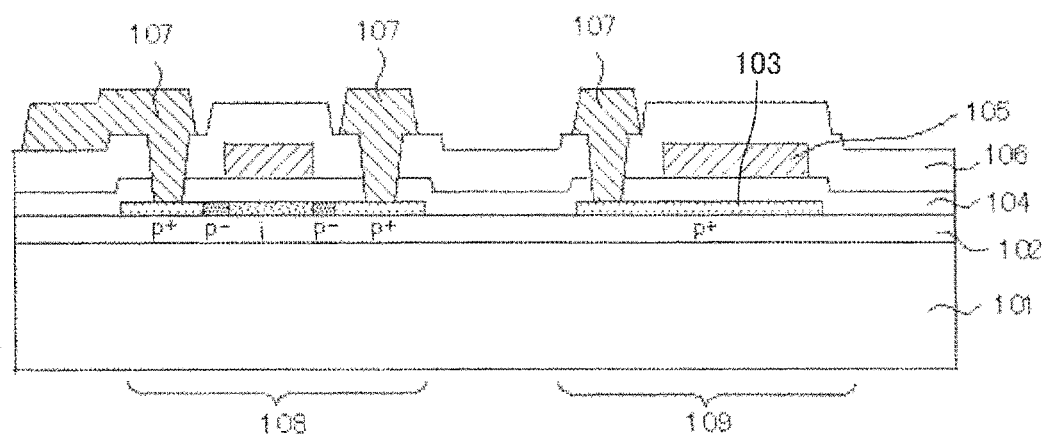
FIG. 27 is a section view illustrating a manufacturing procedure (third step) of an organic EL display device according to the first example, specially extracting a TFT part, a retention capacitor and a light emitting element illustrated in one subpixel for explanation purpose, corresponding to FIG. 26.

Next, as illustrated in FIGS. 26 and 27, the CVD method or the like is used to deposit, for example, a silicon oxide film to form an interlayer insulation film 106. Anisotropic etching is performed on the interlayer insulation film 106 and the gate insulation film 104, to open a contact hole for connection to the poly silicon layer 103 and a contact hole for connection to the power supply line 105c. Next, using the spattering technique, the second metal layer 107 made of, for example, aluminum alloy such as Ti/Al/Ti is deposited, and patterning is performed to form the source/drain electrode, the data line 107a, the power supply line 107b, and the first contact part 107c (rectangle part colored in black). This allows connection between the data line 107a and the drain of the M1 switch TFT 108a, between the source of the M1 switch TFT 108a and the retention capacitance electrode 105b as well as the gate of the M2 drive TFT 108b, and between the sources of the M2 drive TFT 108b and the power supply line 107b. The drain electrodes of the M2 drive TFTs 108b are formed with different shapes for every row and every subpixel as illustrated in FIG. 26 so that they may be connected to the anode electrodes for each color of RGB to be formed in the next process.

Figure 28:
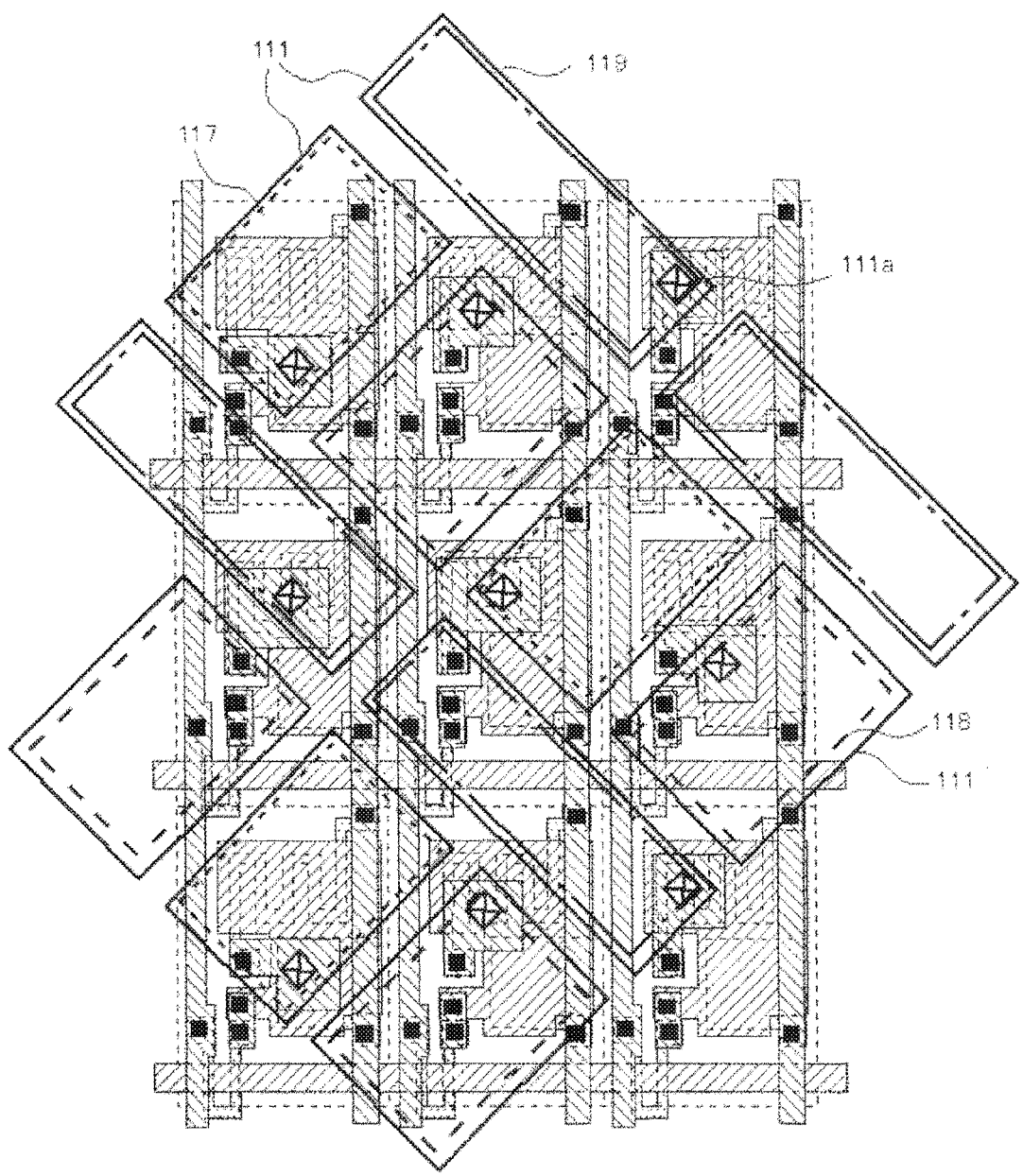
FIG. 28 is a plan view illustrating a manufacturing procedure (fourth step) of an organic EL display device according to the first example.
Figure 29:
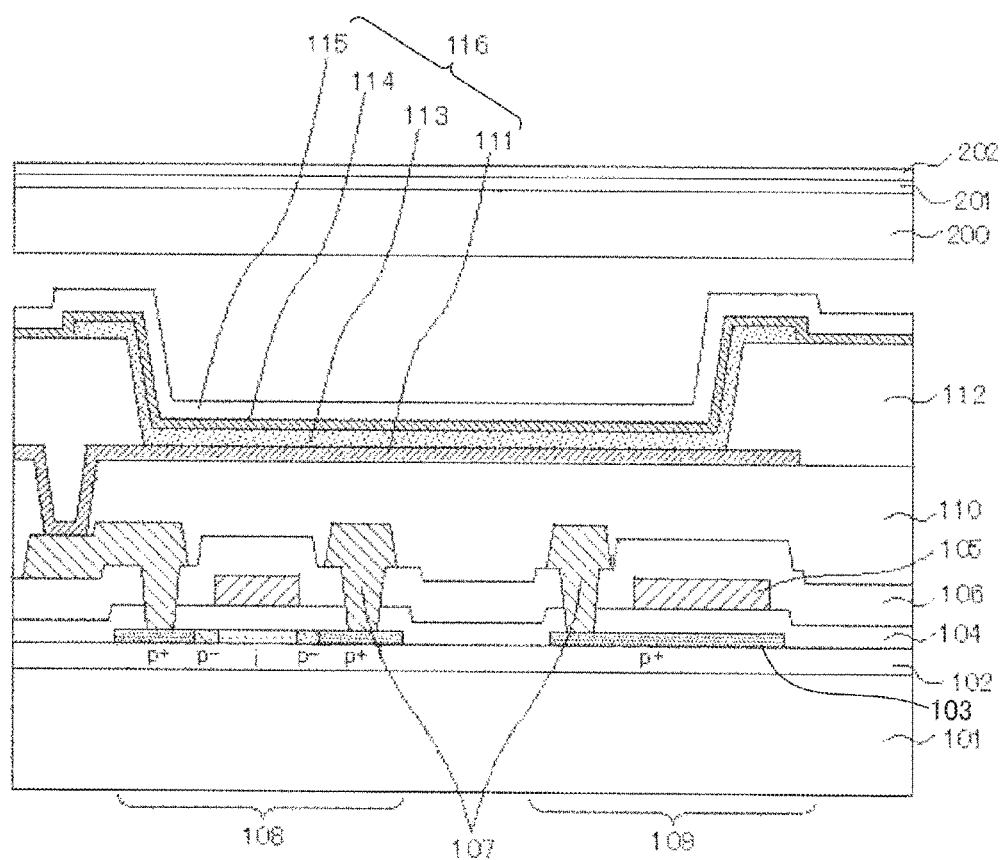
FIG. 29 is a section view illustrating a manufacturing procedure (fourth step) of an organic EL display device according to the first example, specially extracting a TFT part, a retention capacitor and a light emitting element illustrated in one subpixel for explanation purpose, corresponding to FIG. 28.

Next, as illustrated in FIGS. 28 and 29, a photosensitive organic material is deposited to form a planarization film 110. The exposing condition is optimized to adjust a taper angle, to open a contact hole (part enclosed by a thick solid line marked with x) for connection to the drain of the M2 drive TFT 108b. Here, the contact holes are formed at different positions for every row and every subpixel as illustrated in FIG. 28 so that the drain of the M2 drive TFT 108b for every subpixel may be connected to the anode electrode 111 for each color of RGB. A reflection film is deposited thereon with metal of Ag, Mg, Al, Pt, Pd, Au, Ni, Nd, Ir, Cr or a compound thereof, and subsequently a transparent film of ITO, IZO, ZnO, In$_2$O$_3$ or the like is deposited thereon, while patterning is performed at the same time to form an anode electrode 111 for each subpixel. Here, in order to arrange light-emitting regions for each color of RGB in the direction inclined to the extending directions of the data line 107a and the gate electrode 105a, the anode electrode 111 is formed as illustrated in FIG. 28 to be connected to the drain of the M2 drive TFT 108b at the second contact part 111a. Though the anode electrode 111 requires a reflection film since it also serves as a reflection film (not shown) in the top emission structure, the reflection film may be eliminated in the case of a bottom emission structure and the anode electrode 111 may be formed only with a transparent film such as ITO. Next, the spin coating technique is used to deposit, for example, a photosensitive organic resin film to form an element isolation film and then patterning is performed to form an element isolation layer 112 in which the anode electrode 111 of each subpixel is exposed to the bottom. This element isolation layer 112 serves to isolate the light emitting region of each subpixel.

Next, the glass substrate 101 where the element isolation layer 112 is formed is set to a deposition machine device, the FMM in which an opening is formed only in same color part of subpixel as needed or the open mask which has an opening only in the display screen region and the periphery thereof is fixed with positioning alignment, and organic material is deposited to form the organic EL layer 113. The organic EL layer 113 is constituted by, for example, a hole injection layer, a hole transportation layer, a light emission layer, an electron transportation layer, an electron injection layer and the like from the lower layer side. Moreover, the organic EL layer 113 may have any structure of the combinations including: electron transportation layer/light emission layer/hole transportation layer; electron transportation layer/light emission layer/hole transportation layer/hole injection layer; and electron injection layer/electron transportation layer/light emission layer/hole transportation layer, or may be a light emission layer alone, or may also be added with an electron blocking layer or the like. The material for the light emission layer is different for each color, while the film thickness of the hole injection layer, the hole transportation layer or the like is individually controlled for each subpixel as needed.

Metal having a small work function, i.e. Li, Ca, LiF/Ca, LiF/Al, Al, Mg or a compound thereof, is vapor-deposited on the organic EL layer 113 to form a cathode electrode 114. The film thickness of the cathode electrode 114 is optimized to increase the light extraction efficiency and to ensure preferable viewing angle dependence. In the case where the cathode electrode 114 has a high resistance thereby losing the uniformity in luminance, an auxiliary electrode layer is added thereon with a substance for forming a transparent electrode such as ITO, IZO, ZnO or $In_2O_3$. Furthermore, in order to improve the light extraction efficiency, an insulation film having a refractive index higher than that of glass is deposited to form a cap layer 115. The cap layer 115 also serves as a protection layer for the organic EL element.

As described above, the light emitting element 116 corresponding to each subpixel of RGB is formed, and a portion where the anode electrode 111 and the organic EL layer 113 are in contact with each other (the aperture part of the element separation layer 112) will be the R light emitting region 117, the G light emitting region 118 or the B light emitting region 119.

In the case where the light emitting element 116 has a bottom emission structure, the cathode electrode 114 (transparent electrode such as ITO) is formed on the upper layer of the planarization film 110, whereas the anode electrode 111 (reflection electrode) is formed on the organic EL layer 113. Since the bottom emission structure does not require light extraction to the upper surface, a metal film of Al or the like may be formed thick, which can significantly reduce the resistance value of the cathode electrode and thus the bottom emission structure is suitable for a large device. It is, however, not suitable to a highly precise structure due to an extremely small light emitting region because the TFT element and the wiring part cannot transmit light.

Next, a glass frit coats around the outer circumference of the TFT substrate 100, a sealing glass substrate 200 is mounted thereon, and the glass frit part is heated and melted with laser or the like to tightly seal the TFT substrate 100 and the sealing glass substrate 200. Thereafter, a λ/4 retardation plate 201 and a polarization plate 202 are formed on the light emission side of the sealing glass substrate 200, to complete the organic EL display device.

While FIGS. 22 to 29 illustrate an example of the method of manufacturing an organic EL display device according to the first example, the manufacturing method is not particularly limited thereto if the pixel arrangement structure described in the embodiment may be realized.

Second Example

Next, an electro optical device and an electric apparatus according to the second example will be described with reference to FIGS. 30 to 33. In the second example, various types of electric apparatus including an organic EL display device as a display means will be described as an application example of the organic EL display device.

Figure 30:
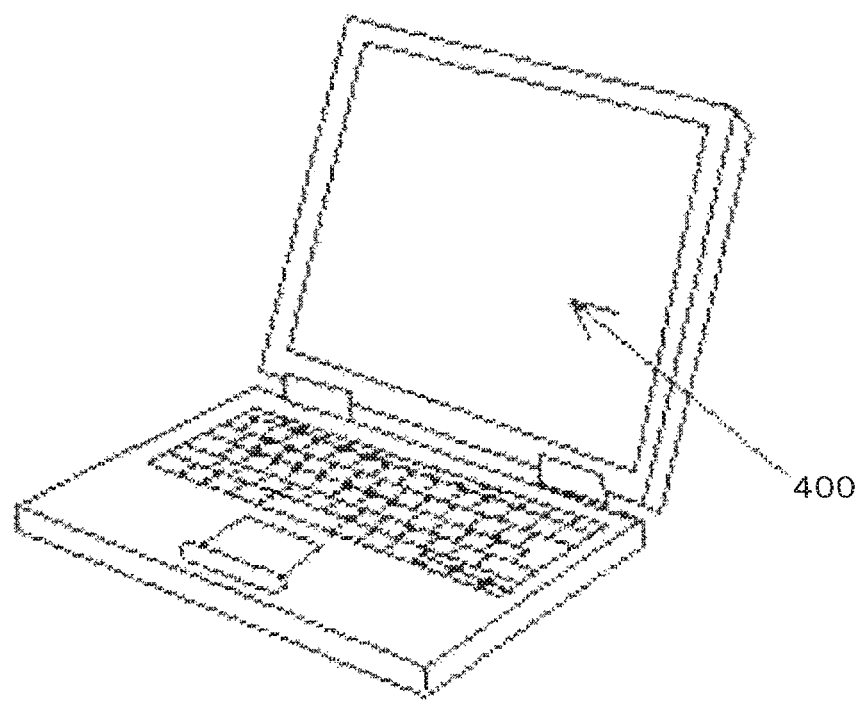
FIG. 30 is a schematic view illustrating an application example of an organic EL display device according to the second example.
Figure 31:
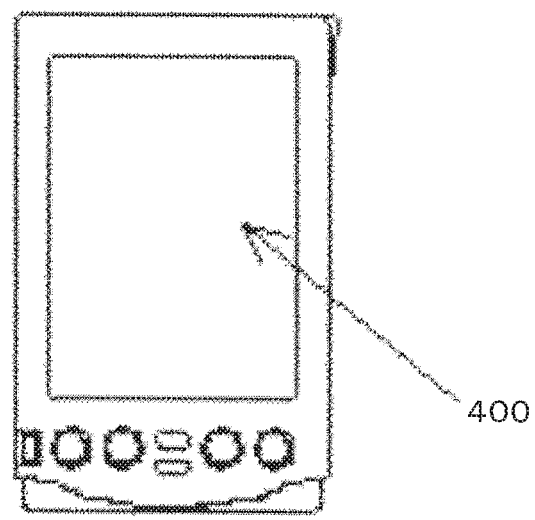
FIG. 31 is a schematic view illustrating an application example of an organic EL display device according to the second example.
Figure 32:
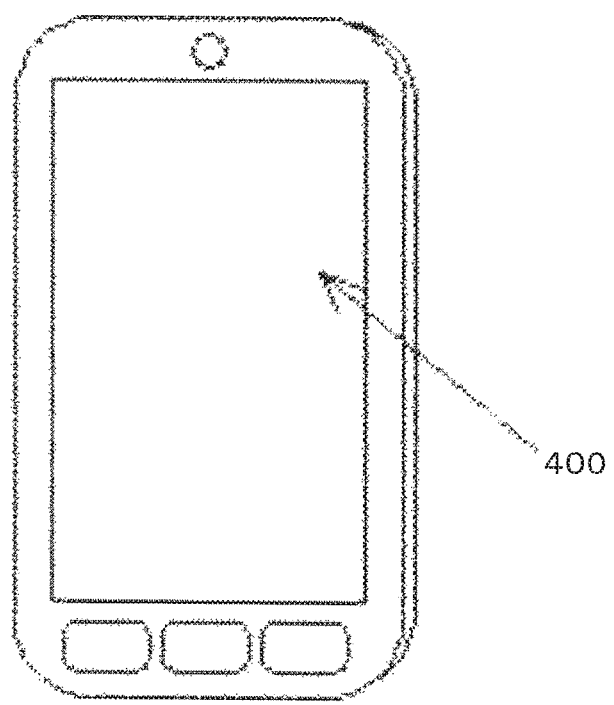
FIG. 32 is a schematic view illustrating an application example of an organic EL display device according to the second example.
Figure 33:
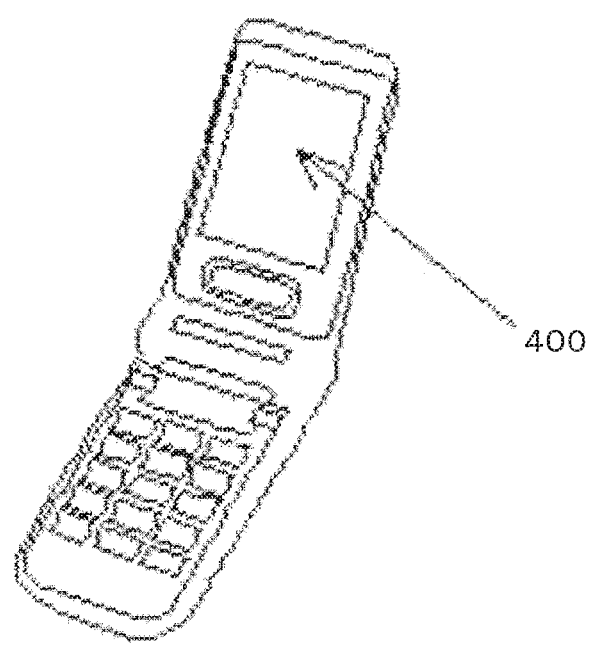
FIG. 33 is a schematic view illustrating an application example of an organic EL display device according to the second example.

FIGS. 30 to 33 illustrate examples of electric apparatus to which an electro optical device (organic EL display device) is applied. FIG. 30 is an example of application to a personal computer, FIG. 31 is an example of application to a portable terminal device such as a personal digital assistant (PDA), an electronic notebook, an electronic book, a tablet terminal, FIG. 32 is an example of application to a smartphone, and FIG. 33 is an example of application to a mobile phone. The organic EL display device 400 may be utilized for a display part of these types of electric apparatus. Application may be possible to any electric apparatus provided with a display device without specific limitation, for example, to a digital camera, a video camera, a head mounted display, a projector, a facsimile device, a portable TV, a demand side platform (DSP) device and the like.

Third Example

Next, an electro optical device and electric apparatus according to the third example will be described with reference to FIGS. 34 to 37. While a case where the organic EL display device as the electro optical device is applied to electric apparatus provided with a planar display part is described in the second example above, the organic EL display device may also be applied to electric apparatus requiring a curved display part by making it deformable.

Figure 34:
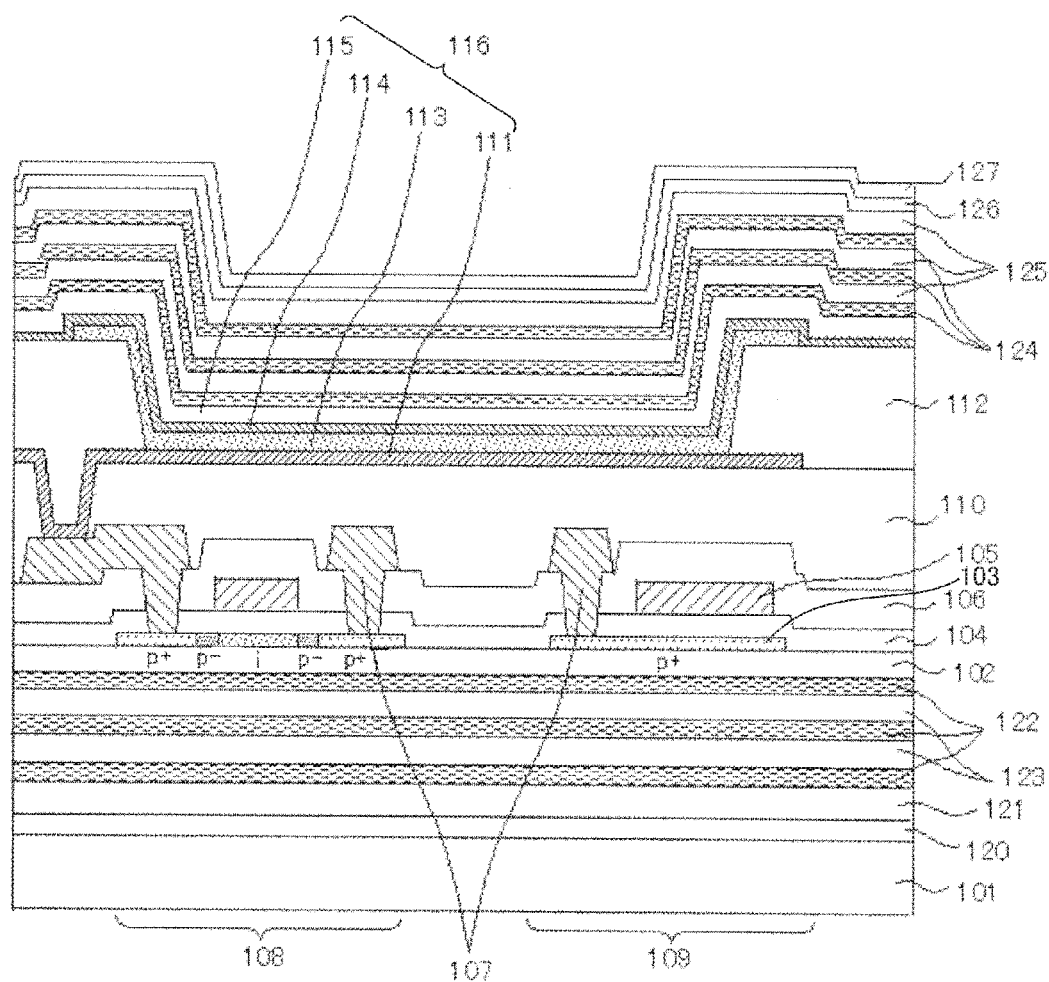
FIG. 34 is a section view schematically illustrating a structure of an organic EL display device according to the third example.

FIG. 34 is a section view illustrating a structure of a deformable organic EL display device. This structure is different from the first example described above in that (1) TFT part 108 (M1 switch TFT 108a, M2 drive TFT 108b) and retention capacitance part 109 are formed on a flexible substrate, and (2) no sealing glass substrate 200 is arranged on the light emitting element 116.

First, as to (1), a stripping film 120 such as organic resin which can be removed with a stripping solution is formed on a glass substrate 101, and a flexible substrate 121 having flexibility made of, for example, polyimide is formed thereon. Next, an inorganic thin film 122 such as a silicon oxide film or silicon nitride film and an organic film 123 such as organic resin are alternately layered. Then, on the top layer film (inorganic thin film 122 here), an underlying insulation film 102, a poly silicon layer 103, a gate insulation film 104, a first metal layer 105, an interlayer insulation film 106, a second metal layer 107 and a planarization film 110 are sequentially formed, to form a TFT part 108 and a retention capacitance part 109, according to the manufacturing method described in the first example.

Moreover, as to (2), the anode electrode 111 and the element separation layer 112 are formed on the planarization film 110, and the organic EL layer 113, the cathode electrode 114 and the cap layer 115 are sequentially formed on the bank layer from which the element separation layer 112 is removed, to form the light emitting element 116. Thereafter, an inorganic thin film 124 of a siliconoxide film, silicon nitride film or the like and an organic film 125 of organic resin or the like are alternately layered on the cap layer 115, and a λ/4 retardation plate 126 and a polarization plate 127 are formed on the top layer film (organic film 125 here).

Thereafter, the stripping film 120 on the glass substrate 101 is removed with a stripping solution or the like, to detach the glass substrate 101. In this structure, since the glass substrate 101 and the sealing glass substrate 200 are eliminated while the entire organic EL display device is deformable, application may be possible to electric apparatus having different purposes which requires a curved display part, particularly to wearable electric apparatus.

Figure 35:
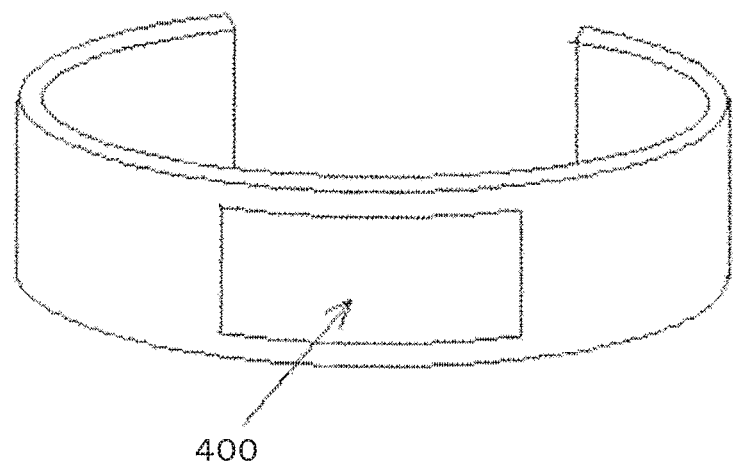
FIG. 35 is a schematic view illustrating an application example of an organic EL display device according to the third example.

For example, the organic EL display device 400 may be utilized for a display part of wrist band electric apparatus to be attached on a wrist as illustrated in FIG. 35 (terminal linked with a smartphone, terminal provided with a global positioning system (GPS) function, terminal for measuring human body information such as pulse or body temperature, for example). In the case of the terminal linked with a smartphone, a communication means provided in the terminal in advance (short distance wireless communication unit which operates in accordance with a standard such as Bluetooth (registered trademark) or near field communication (NFC)) may be used to display received image data or video data on the organic EL display device 400. Furthermore, in the case of a terminal provided with a GPS function, it is possible to display the positional information, the moving distance information and the moving speed information specified based on GPS signals on the organic EL display device 400. Moreover, in the case of a terminal for measuring human body information, the measured information may be displayed on the organic EL display device 400.

Figure 36:
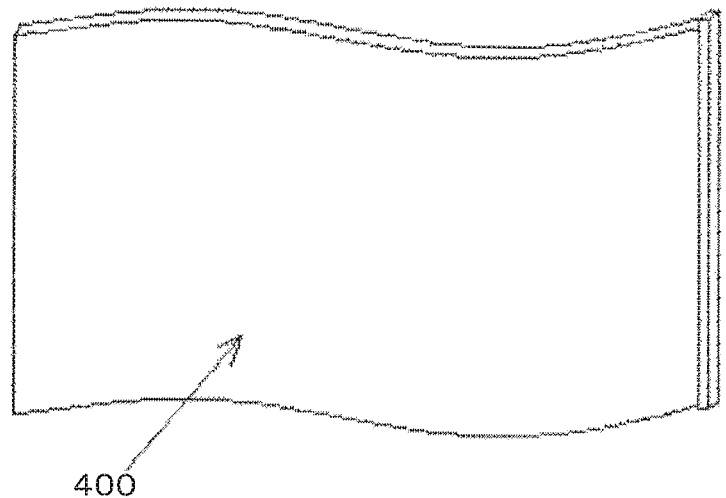
FIG. 36 is a schematic view illustrating another application example of an organic EL display device according to the third example.

Furthermore, the organic EL display device 400 may also be utilized for an electronic paper as illustrated in FIG. 36. For example, the image data or video data, stored in a storage part located at an end of an electronic paper may be displayed on the organic EL display device 400, or the image data or video data received through an interface means (e.g., a wired communication unit such as universal serial bus (USB) or a wireless communication unit which operates in accordance with a standard such as Ethernet (registered trademark), fiber-distributed data interface (FDDI) or Token Ring located at an end of the electronic paper, may be displayed on the organic EL display device 400.

Figure 37:
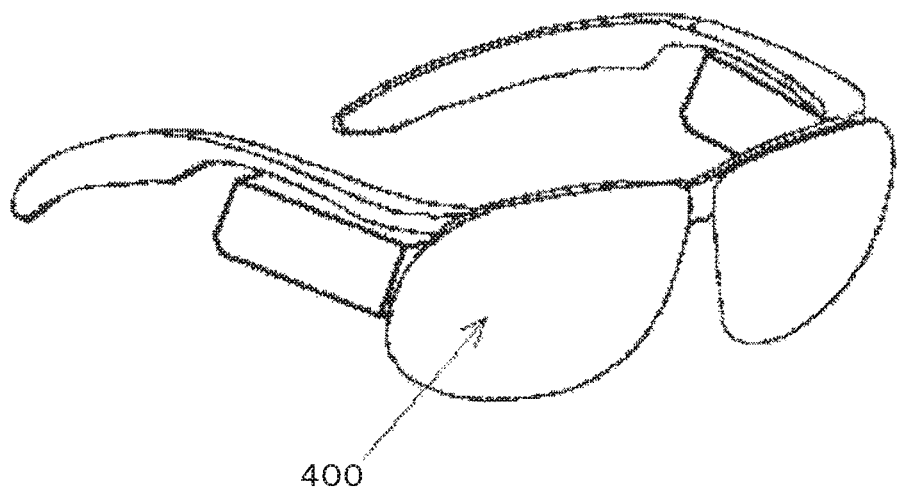
FIG. 37 is a schematic view illustrating another application example of an organic EL display device according to the third example.

Moreover, the organic EL display device 400 may also be utilized for the display part of a glass-type electronic apparatus to be attached to a face, as illustrated in FIG. 37. For example, the image data or video data stored in a storage part located at a temple of eyeglasses, sunglasses, goggles or the like may be displayed on the organic EL display device 400, or the image data or video data received through an interface means located at the temple (e.g., wire communication unit such as USB, short-distance wireless communication unit which operates in accordance with a standard such as Bluetooth (registered trademark) or NFC, or mobile communication unit for communicating through a mobile communication network such as long term evolution (LTE)/3G), may be displayed on the organic EL device 400.

It is to be understood that the present invention is not limited to the examples described above, but may appropriately be modified for the type or structure of the electro optical device, material of each component, fabrication method and the like without departing from the spirit of the present invention.

For example, though the present embodiments and examples described that the subpixels are three colors of RGB, the above-described pixel arrangement structure may also be applicable to any three colors having different luminosity factors.

Furthermore, the electro optical device is not limited to the organic EL display device as described in the embodiments and examples. Also, the substrate which constitutes pixels is not limited to the TFT substrate as described in the embodiments and examples. The substrate which constitutes pixels may also be applicable to a passive substrate, not limited to an active substrate. Further, though a circuit constituted by an M1 switch TFT, an M2 drive TFT and a C1 retention capacitance (so-called 2T1C circuit) has been illustrated as a circuit to control pixels, a circuit including three or more transistors (e.g., 3T1C circuit) may also be employed.

The present invention may be applicable to a pixel array with a pixel arrangement structure in which an aperture in a pixel array in the S stripe arrangement where R and G are arranged adjacent to each other in the same column and B is arranged in the row of R and G is rotated in an arbitrary angle, to an electro optical device such as an organic EL display device having the pixel array, and to an electric apparatus using the electro optical device as a display device.

According to the pixel array described above, a pixel arrangement structure in which a pixel array in the S stripe arrangement is inclined at a predetermined angle (preferably 45 degrees) (pixel arrangement structure in which the light emitting region of each subpixel is inclined without changing the extending directions of circuit elements and wirings for each subpixel) is employed, while the data line for driving each subpixel is connected to subpixels of two colors and combinations of two colors are changed in rotation. Thus, the pixel pitches in the horizontal and vertical directions are substantially narrowed without reduction in the size of an aperture in FMM, and the resolution can be enhanced.

Furthermore, the drive pattern for different pixels is categorized into seven patterns according to a combination of subpixels, and adjacent pixels are driven with a combination of patterns selected from these seven patterns depending on an image to be displayed, so that the boundary of an arbitrary image may smoothly be displayed.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A pixel array, in which pixels are two-dimensionally arranged, each of the pixels being constituted by a subpixel of a first color having a highest luminosity factor, a subpixel of a second color and a subpixel of a third color having a lowest luminosity factor, the pixel array comprising:
   a circuit element in each of subpixels of the first color, the second color, and the third color in each of the pixels arranged in a row direction;
   a data line extending in a column direction and connected to the circuit element in each of the subpixels;
   a gate line extending in the row direction and connected to the circuit element in each of the subpixels;
   a plurality of light emitting regions of subpixels of the first color and a plurality of light emitting regions of subpixels of the second color arranged linearly in a first direction inclined with respect to both the column direction in which the data line extends and the row direction in which the gate line extends; and
   a plurality of light emitting regions of subpixels of the third color arranged linearly in a second direction orthogonal to the first direction, with respect to the light emitting regions of the subpixels of the first color and the light emitting regions of the subpixels of the second color, the second direction being inclined with respect to both the column direction in which the data line extends and the row direction in which the gate line extends,
   wherein the data line connected to circuit elements in subpixels of two colors of the first color and the second color, the data line connected to circuit elements in subpixels of two colors of the second color and the third color, and the data line connected to circuit elements in subpixels of two colors of the third color and the first color are repeatedly arranged.

2. The pixel array according to claim 1, wherein
   each of the data lines is connected to a circuit element in a subpixel of a former color of the two colors in an odd-numbered column, and is connected to a circuit element in a subpixel of a latter color of the two colors in an even-numbered column.

3. The pixel array according to claim 2, wherein
   a circuit element in a subpixel of the second color, a circuit element in a subpixel of the first color, a circuit element in a subpixel of the third color are arranged in this order in the row direction, the data line connected to a circuit element in a subpixel of the second color in an odd-numbered column is connected to a circuit element in a subpixel of the third color in an even-numbered column, the data line connected to a circuit element in a subpixel of the first color in an odd-numbered column is connected to a circuit element in a subpixel of the second color in an even-numbered column, and the data line connected to a circuit element in a subpixel of the third color in an odd-numbered column is connected to a circuit element in a subpixel of the first color in an even-numbered column.

4. The pixel array according to claim 1, wherein a boundary of an image is displayed by combining one subpixel of the first color, one subpixel of the second color and one subpixel of the third color in each of two pixels adjacent to each other in the first direction or the second direction.

5. The pixel array according to claim 4, wherein a combination of subpixels of three colors in the two pixels is changed in accordance with an extending direction of the boundary of the image.

6. The pixel array according to claim 1, wherein in each of the pixels, the light emitting region of the subpixel of the first color and the light emitting region of the subpixel of the second color are displaced toward a side of the subpixel of the first color along the first direction with respect to a line in the second direction running through a center of the light emitting region of the subpixel of the third color.

7. The pixel array according to claim 1, wherein the first color is G (Green), the second color is R (Red) and the third color is B (Blue).

8. An electro optical device, comprising:
the pixel array according to claim 1; and
a circuit part driving the pixel array.

9. An electric apparatus, comprising:
as a display device, an organic electroluminescence device in which the pixel array according to claim 1 including an organic electroluminescence material in the light emitting region and a circuit part driving the pixel array are formed on a substrate.

10. The pixel array according to claim 1, wherein the subpixel of the first color and the subpixel of the second color are adjacent each other in the first direction.

11. The pixel array according to claim 10, wherein an area of each of the light emitting regions of the subpixels of the third color is larger than an area of each of the light emitting regions of the subpixels of the first color and an area of each of the light emitting regions of the subpixels of the second color.

12. The pixel array according to claim 1, wherein an area of each of the light emitting regions of the subpixels of the third color is larger than an area of each of the light emitting regions of the subpixels of the first color and an area of each of the light emitting regions of the subpixels of the second color.

13. The pixel array according to claim 12, wherein each of the pixels is constituted by the subpixel of the first color, the subpixel of the second color adjacent to the subpixel of the first color, and the subpixel of the third color adjacent to both the subpixel of the first color and the subpixel of the second color.

14. The pixel array according to claim 1, wherein each of the pixels is constituted by the subpixel of the first color, the subpixel of the second color adjacent to the subpixel of the first color, and the subpixel of the third color adjacent to both the subpixel of the first color and the subpixel of the second color.

15. The pixel array according to claim 1, wherein each of the light emitting regions includes an anode electrode, a cathode electrode, and an organic electroluminescence layer between the anode electrode and the cathode electrode, each of the circuit elements includes a driving thin film transistor including a source and a drain, and a contact part which connects the anode electrode and the drain or the source, and a position of the contact part in the circuit element in a subpixel in an even-numbered row is different from a position of the contact part in the circuit element in a subpixel in an odd-numbered row.

16. A method of driving a pixel array in which pixels are two-dimensionally arranged, each of the pixels being constituted by a subpixel of a first color having a highest luminosity factor, a subpixel of a second color and a subpixel of a third color having a lowest luminosity factor, the method comprising:

providing a data line extending in a column direction and connected to a circuit element provided in each of the subpixels of the first color, the second color, and the third color in each of the pixels arranged in a row direction;

providing a gate line extending in the row direction and connected to the circuit element in each of the subpixels;

providing a plurality of light emitting regions of subpixels of the first color and a plurality of light emitting regions of subpixels of the second color arranged linearly in a first direction inclined with respect to both the column direction in which the data line extends and the row direction in which the gate line extends;

providing a plurality of light emitting regions of subpixels of the third color arranged linearly in a second direction orthogonal to the first direction, with respect to the light emitting regions of the subpixels of the first color and the light emitting regions of the subpixels of the second color, the second direction being inclined with respect to both the column direction in which the data line extends and the row direction in which the gate line extends;

categorizing drive patterns for the pixels into a first pattern in which all of a subpixel of the first color, a subpixel of the second color, and a subpixel of the third color are turned on, a second pattern in which a subpixel of the first color and a subpixel of the second color are turned on, a third pattern in which a subpixel of the first color and a subpixel of the third color are turned on, a fourth pattern in which a subpixel of the second color and a subpixel of the third color are turned on, a fifth pattern in which a subpixel of the first color is turned on, a sixth pattern in which a subpixel of the second color is turned on, and a seventh pattern in which a subpixel of the third color is turned on;

deciding a combination of patterns corresponding to a plurality of pixels adjacent to each other in the first direction or the second direction near a boundary of the image, depending on an image to be displayed in the display region; and driving the plurality of pixels with a decided combination of patterns.

17. The method of driving a pixel array according to claim 16, further comprising:

driving two pixels adjacent to each other in the first direction or the second direction near the boundary, with a combination of the second pattern and the seventh pattern, a combination of the third pattern and the sixth pattern, or a combination of the fourth pattern and the fifth pattern.

18. The method of driving a pixel array according to claim 16, further comprising:
driving three pixels adjacent to one another in the first direction or the second direction near the boundary, with a combination of the first pattern, the second pattern and the seventh pattern, a combination of the first pattern, the third pattern and the sixth pattern, or a combination of the first pattern, the fourth pattern and the fifth pattern.

19. The method of driving a pixel array according to claim 16, wherein
the first color is G (Green), the second color is R (Red) and the third color is B (Blue).

20. A pixel array, in which pixels are two-dimensionally arranged, each of the pixels being constituted by a subpixel of a first color having a highest luminosity factor, a subpixel of a second color and a subpixel of a third color having a lowest luminosity factor, the pixel array comprising:
a circuit element in each of subpixels of the first color, the second color and the third color in each of the pixels arranged in a row direction;
a light emitting region of a subpixel of the first color and a light emitting region of a subpixel of the second color arranged in a first direction inclined to the row direction;
a light emitting region of a subpixel of the third color arranged in a second direction orthogonal to the first direction, with respect to the light emitting region of the subpixel of the first color and the light emitting region of the subpixel of the second color; and
a data line extending in a column direction and connected to a circuit element in each of the subpixels, wherein
the data line connected to circuit elements in subpixels of two colors of the first color and the second color, the data line connected to circuit elements in subpixels of two colors of the second color and the third color, and the data line connected to circuit elements in subpixels of two colors of the third color and the first color are repeatedly arranged,
each of the data lines is connected to a circuit element in a subpixel of a former color of the two colors in an odd-numbered column, and is connected to a circuit element in a subpixel of a latter color of the two colors in an even-numbered column,
a circuit element in a subpixel of the second color, a circuit element in a subpixel of the first color, a circuit element in a subpixel of the third color are arranged in this order in the row direction,
the data line connected to a circuit element in a subpixel of the second color in an odd-numbered column is connected to a circuit element in a subpixel of the third color in an even-numbered column,
the data line connected to a circuit element in a subpixel of the first color in an odd-numbered column is connected to a circuit element in a subpixel of the second color in an even-numbered column, and
the data line connected to a circuit element in a subpixel of the third color in an odd-numbered column is connected to a circuit element in a subpixel of the first color in an even-numbered column.

* * * * *